US012635157B2

(12) United States Patent
Oh et al.

(10) Patent No.: US 12,635,157 B2
(45) Date of Patent: May 19, 2026

(54) METHOD FOR FABRICATING SEMICONDUCTOR DEVICE

(71) Applicant: SAMSUNG ELECTRONICS CO., LTD., Suwon-si (KR)

(72) Inventors: Se Woung Oh, Suwon-si (KR); Hyung Dong Kim, Suwon-si (KR); Sang Mo Koo, Suwon-si (KR); Han Sung Kim, Suwon-si (KR); Young Dae Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 362 days.

(21) Appl. No.: 18/384,008

(22) Filed: Oct. 26, 2023

(65) Prior Publication Data

US 2024/0222468 A1     Jul. 4, 2024

(30) Foreign Application Priority Data

Dec. 30, 2022     (KR) ........................ 10-2022-0190128

(51) Int. Cl.
*H10D 30/01*          (2025.01)
*H10D 30/43*          (2025.01)
(Continued)

(52) U.S. Cl.
CPC .......... *H10D 30/014* (2025.01); *H10D 30/43* (2025.01); *H10D 30/6735* (2025.01); *H10D 30/6757* (2025.01); *H10D 62/121* (2025.01); *H10D 64/01* (2025.01); *H10D 64/015* (2025.01); *H10D 64/017* (2025.01); *H10D*

*64/018* (2025.01); *H10D 64/021* (2025.01); *H10D 64/254* (2025.01)

(58) Field of Classification Search
CPC .. H10D 30/014; H10D 30/43; H10D 30/6735; H10D 30/6757; H10D 62/121; H10D 64/01; H10D 64/015; H10D 64/017; H10D 64/018; H10D 64/021; H10D 64/254; H10D 30/797; H10D 62/021; H10D 64/671
See application file for complete search history.

(56) References Cited

U.S. PATENT DOCUMENTS 9,276,064 B1     3/2016   Zang et al.
10,522,342 B2    12/2019  Doris et al.
(Continued)

FOREIGN PATENT DOCUMENTS

KR     10-2006-0045451 A     5/2006

*Primary Examiner* — Thanh Y. Tran
(74) *Attorney, Agent, or Firm* — Fish & Richardson P.C.

(57) ABSTRACT

A method for fabricating a semiconductor device includes forming an active pattern on a substrate, forming sacrificial and semiconductor layers alternately stacked on the active pattern, forming a dummy gate and first source/drain trench on one side of the dummy gate by etching the stacked structure, forming a second source/drain trench on the active pattern by etching a sidewall of the sacrificial layer exposed to the first source/drain trench, forming a first inner spacer material layer along sidewall and bottom surfaces of the second source/drain trench, forming a second inner spacer material layer by anisotropic etching a first inner spacer material layer, and forming a third source/drain trench on the active pattern by isotropic etching.

20 Claims, 38 Drawing Sheets

(51) Int. Cl.
<br>H10D 30/67 (2025.01)
<br>H10D 62/10 (2025.01)
<br>H10D 64/01 (2025.01)
<br>H10D 64/23 (2025.01)

(56) References Cited

U.S. PATENT DOCUMENTS

| | | |
|---|---|---|
| 10,586,856 B2 | 3/2020 | Loubet et al. |
| 10,804,165 B2 | 10/2020 | Seo et al. |
| 10,937,862 B2 | 3/2021 | Reznicek et al. |
| 2020/0381545 A1* | 12/2020 | Chiang ................ H10D 62/121 |
| 2021/0134795 A1 | 5/2021 | Ju et al. |
| 2022/0093767 A1* | 3/2022 | Liaw .................... H10D 62/116 |
| 2022/0157969 A1 | 5/2022 | Yin et al. |
| 2022/0310851 A1* | 9/2022 | Min ........................ H10D 30/43 |

* cited by examiner

GSM

ISM1    R2

ISM22

METHOD FOR FABRICATING SEMICONDUCTOR DEVICE

CROSS-REFERENCE TO RELATED APPLICATION

This application claims priority from Korean Patent Application No. 10-2022-0190128 filed on Dec. 30, 2022 in the Korean Intellectual Property Office, and all the benefits accruing therefrom under 35 U.S.C. 119, the contents of which in its entirety are herein incorporated by reference.

BACKGROUND

1. Field

Embodiments relate to a method for fabricating a semiconductor device, and more particularly, to a method for fabricating a semiconductor device including a multi-bridge channel field effect transistor (MBCFET™).

2. Description of the Related Art

As one of the scaling technologies for increasing the density of semiconductor devices, a multi-gate transistor in which a fin or nanowire-shaped silicon body is formed on a substrate and a gate is formed on a surface of the silicon body has been proposed.

Since such a multi-gate transistor uses a three-dimensional channel, it may be easy to perform scaling. In addition, the multi-gate transistor may improve current control capability even without increasing a length of the gate of the multi-gate transistor. In addition, the multi-gate transistor may effectively suppress a short channel effect (SCE) in which a potential of a channel region is affected by a drain voltage.

SUMMARY

Aspects of the present disclosure provide a method for fabricating a semiconductor device that stably forms inner spacers in a multi-bridge channel field effect transistor (MBCFET™) structure.

According to some embodiments there is provided a method for fabricating a semiconductor device, including forming an active pattern extending in a first horizontal direction on a substrate, and forming a stacked structure in which a sacrificial layer and a semiconductor layer are alternately stacked on the active pattern, the stacked structure extending in the first horizontal direction, forming a dummy gate extending in a second horizontal direction different from the first horizontal direction on the active pattern, forming a first source/drain trench on at least one side of the dummy gate on the active pattern by etching the stacked structure, a remaining semiconductor layer being defined as a plurality of nanosheets, forming a second source/drain trench on the active pattern by etching a portion of a sidewall of the sacrificial layer exposed to the first source/drain trench, forming a first inner spacer material layer along a sidewall and a bottom surface of the second source/drain trench, forming a second inner spacer material layer by etching a portion of exposed the first inner spacer material layer by performing a first etching process, which is an anisotropic etching process, at least a portion of the second inner spacer material layer remaining on sidewalls of the nanosheets and the active pattern after the first etching process is performed, forming a third source/drain trench on the active pattern by etching the second inner spacer material layer by performing a second etching process, which is an isotropic etching process, an upper surface of the active pattern and the sidewalls of the plurality of nanosheets being exposed by the third source/drain trench, and the second inner spacer material layer remaining between the plurality of nanosheets being defined as an inner spacer, and forming a source/drain region inside the third source/drain trench.

According to some embodiments of the present disclosure, there is provided a method for fabricating a semiconductor device, the method including forming an active pattern extending in a first horizontal direction on a substrate, and forming a stacked structure in which a sacrificial layer and a semiconductor layer are alternately stacked on the active pattern, the stacked structure extending in the first horizontal direction, forming a dummy gate extending in a second horizontal direction different from the first horizontal direction on the active pattern, forming a first source/drain trench on at least one side of the dummy gate on the active pattern by etching the stacked structure, a remaining semiconductor layer being defined as a plurality of nanosheets, forming a second source/drain trench on the active pattern by etching a portion of a sidewall of the sacrificial layer exposed to the first source/drain trench, forming a first inner spacer material layer along a sidewall and a bottom surface of the second source/drain trench, forming a second inner spacer material layer by etching a portion of exposed the first inner spacer material layer by performing a first etching process, which is a dry etching process, at least a portion of the second inner spacer material layer remaining on sidewalls of the nanosheets and the active pattern after the first etching process is performed, forming a third source/drain trench on the active pattern by etching the second inner spacer material layer by performing a second etching process, which is a wet etching process, an upper surface of the active pattern and the sidewalls of the plurality of nanosheets being exposed by the third source/drain trench, and the second inner spacer material layer remaining between the plurality of nanosheets being defined as an inner spacer, and forming a source/drain region inside the third source/drain trench, wherein a portion of the first inner spacer material layer etched on the sidewalls of the plurality of nanosheets by the first etching process is defined as a first etched portion, and another portion of the first inner spacer material layer etched on the active pattern by the first etching process is defined as a second etched portion, and wherein a first etched thickness of the first etched portion in the first horizontal direction is smaller than a second etched thickness of the second etched portion in a vertical direction.

According to some embodiments, there is provided a method for fabricating a semiconductor device, the method including forming an active pattern extending in a first horizontal direction on a substrate, and forming a stacked structure in which a sacrificial layer and a semiconductor layer are alternately stacked on the active pattern, the stacked structure extending in the first horizontal direction, forming a dummy gate extending in a second horizontal direction different from the first horizontal direction on the active pattern, forming a first source/drain trench on at least one side of the dummy gate on the active pattern by etching the stacked structure, a remaining semiconductor layer being defined as a plurality of nanosheets, forming a second source/drain trench on the active pattern by etching a portion of a sidewall of the sacrificial layer exposed to the first source/drain trench, forming a first inner spacer material layer along a sidewall and a bottom surface of the second source/drain trench, forming a second inner spacer material layer by etching a portion of exposed the first inner spacer material layer by performing a first etching process, which is an anisotropic dry etching process, at least a portion of the second inner spacer material layer remaining on sidewalls of the nanosheets and the active pattern after the first etching process is performed, forming a third source/drain trench on the active pattern by etching the second inner spacer material layer by performing a second etching process, which is an isotropic wet etching process, an upper surface of the active pattern and the sidewalls of the plurality of nanosheets being exposed by the third source/drain trench, and the second inner spacer material layer remaining between the plurality of nanosheets being defined as an inner spacer, and forming a source/drain region inside the third source/drain trench, wherein each of the first inner spacer material layer and the second inner spacer material layer is in contact with the sacrificial layer, wherein a portion of the first inner spacer material layer etched on the sidewalls of the plurality of nanosheets by the first etching process is defined as a first etched portion, and another portion of the first inner spacer material layer etched on the active pattern by the first etching process is defined as a second etched portion, wherein a first etched thickness of the first etched portion in the first horizontal direction is smaller than a second etched thickness of the second etched portion in a vertical direction, and wherein after the first etching process is performed, a thickness of the second inner spacer material layer remaining on the sidewalls of the plurality of nanosheets in the first horizontal direction is greater than a thickness of the second inner spacer material layer remaining on the active pattern in the vertical direction.

BRIEF DESCRIPTION OF THE DRAWINGS

Features will become apparent to those of skill in the art by describing in detail exemplary embodiments with reference to the attached drawings in which:

FIG. 1 is a schematic layout view for describing a semiconductor device fabricated by a method according to some exemplary embodiments;

FIGS. 4 to 22 are intermediate step views for describing a method for fabricating a semiconductor device according to some exemplary embodiment;

Figure 24:
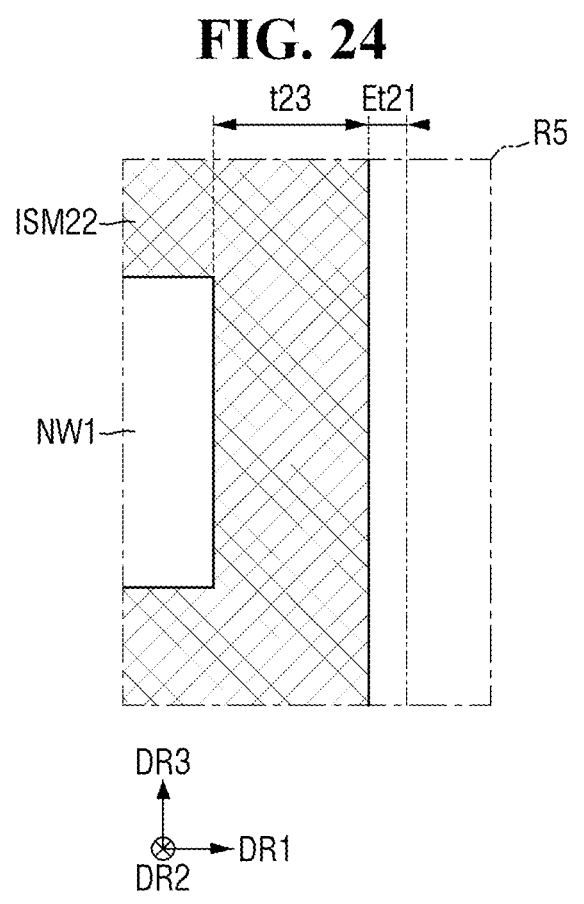

FIG. 24 is an enlarged view of region R5 of FIG. 23;

Figure 25:
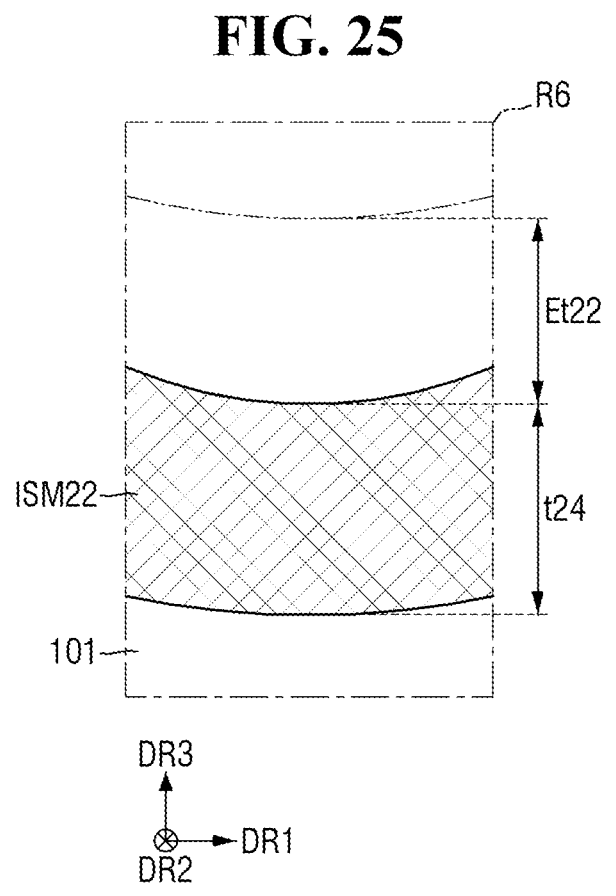

FIG. 25 is an enlarged view of region R6 of FIG. 23;

FIGS. 27 to 33 are intermediate step views for describing a method for fabricating a semiconductor device according to still other exemplary embodiments;

Figure 35:
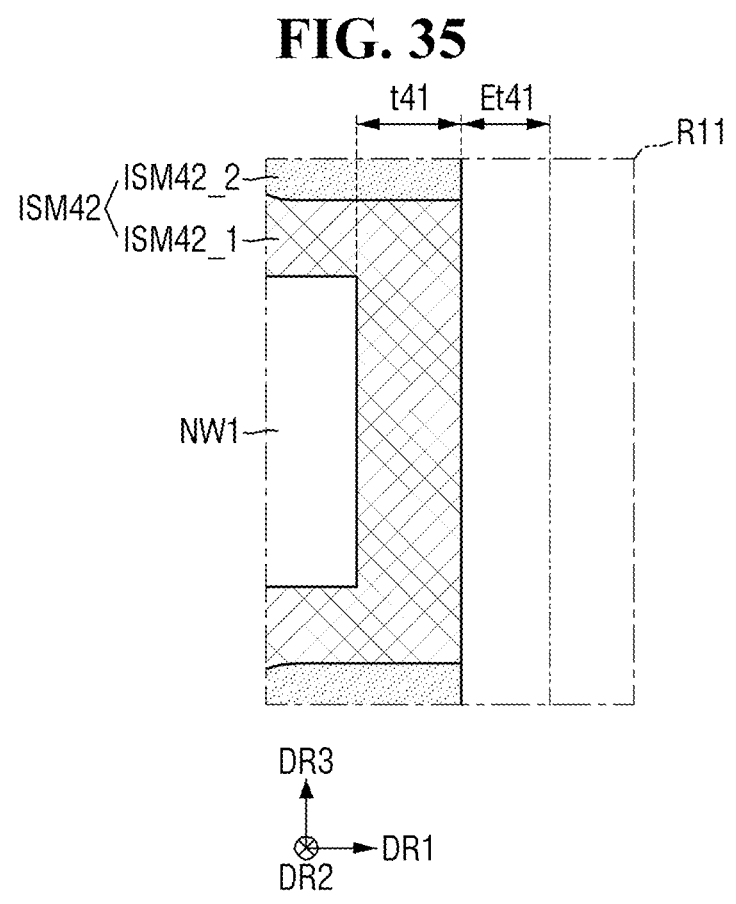

FIG. 35 is an enlarged view of region R11 of FIG. 34;

Figure 36:
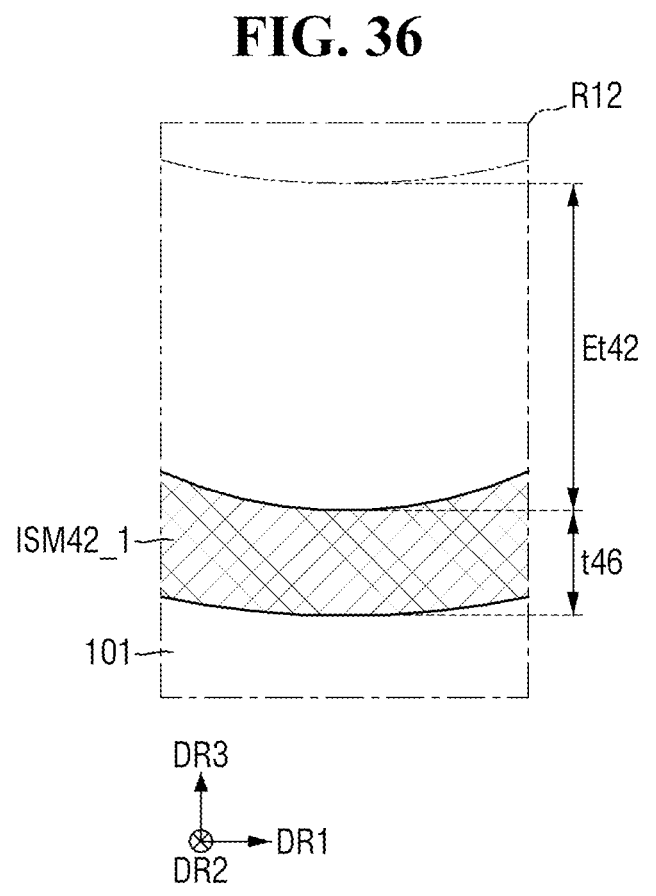

FIG. 36 is an enlarged view of region R12 of FIG. 34;

FIG. 37 is a cross-sectional view for describing a semiconductor device fabricated by a method for fabricating a

Figure 38:
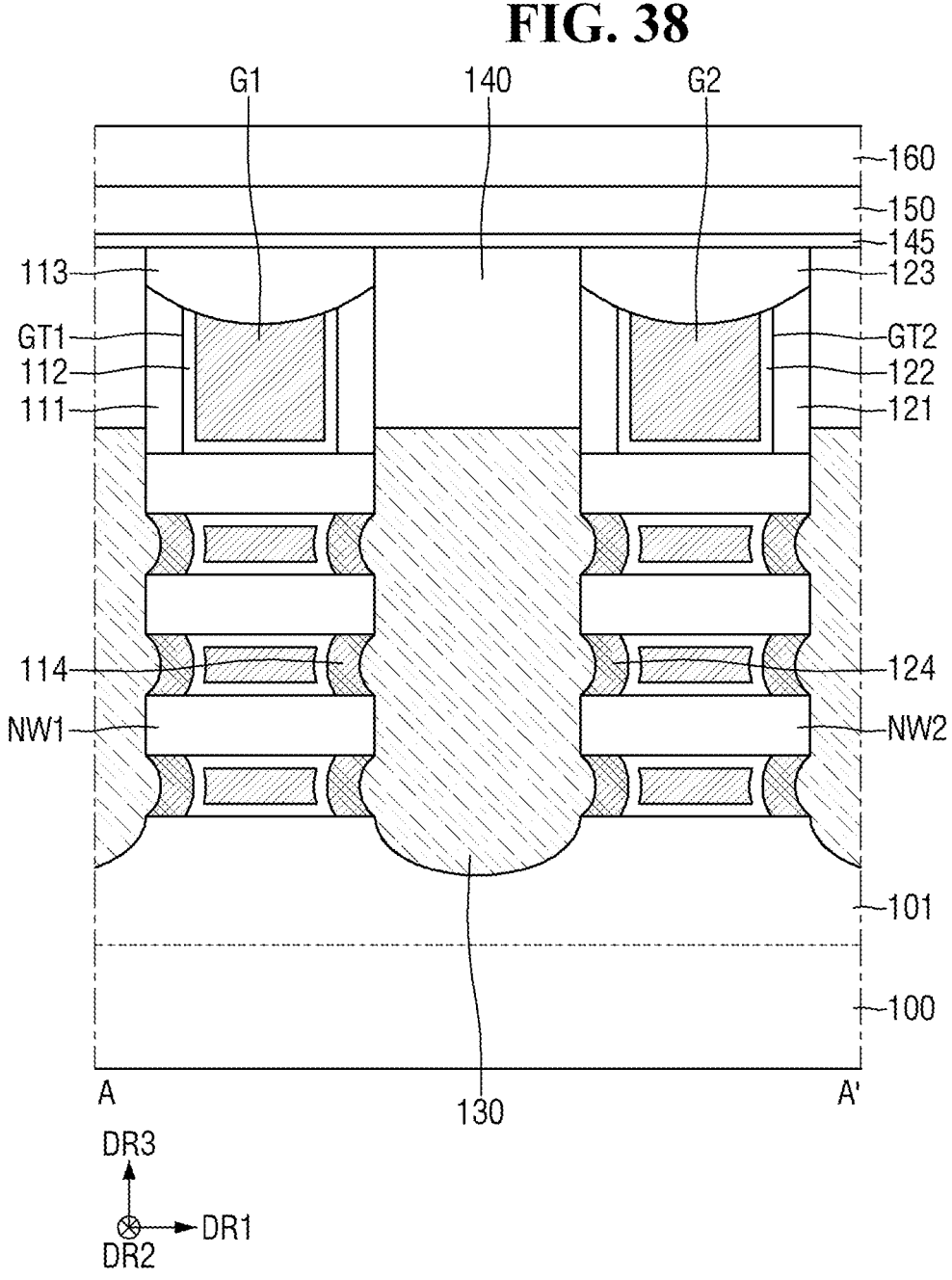

4 semiconductor device according to still other exemplary embodiments of the present disclosure; and FIG. 38 is an intermediate step view for describing a method for fabricating a semiconductor device according to some still other exemplary embodiments.

DETAILED DESCRIPTION

Hereinafter, a semiconductor device fabricated by a method for fabricating a semiconductor device according to some exemplary embodiments of the present disclosure will be described with reference to FIGS. 1 to 3.

Figure 1:
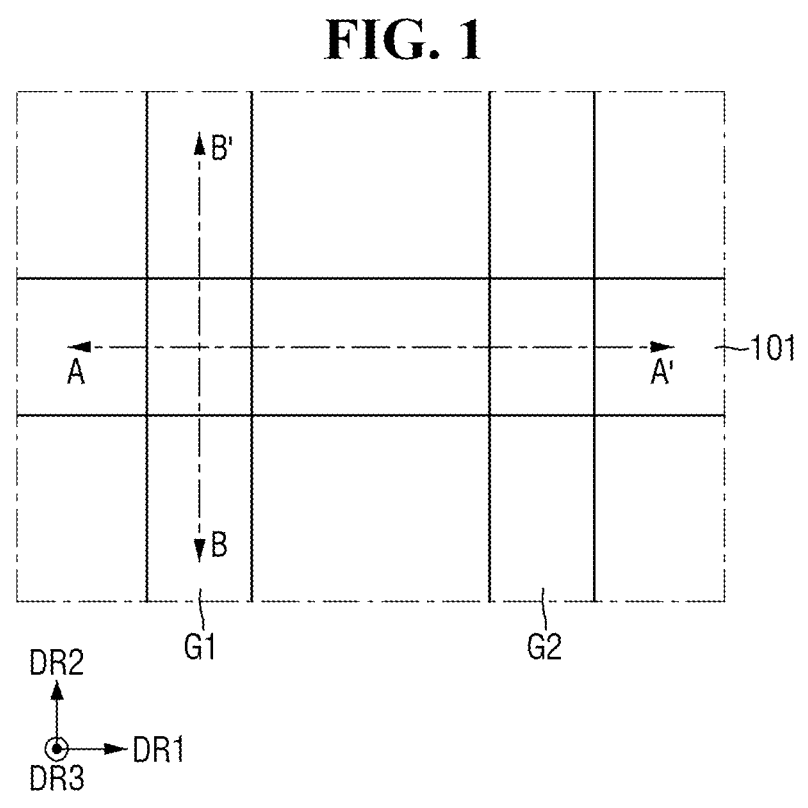

FIG. 1 is a schematic layout view for describing a semiconductor device fabricated by a method for fabricating a semiconductor device according to some exemplary embodiments. FIG. 2 is a cross-sectional view taken along line A-A' of FIG. 1. FIG. 3 is a cross-sectional view taken along line B-B' of FIG. 1.

Figure 2:
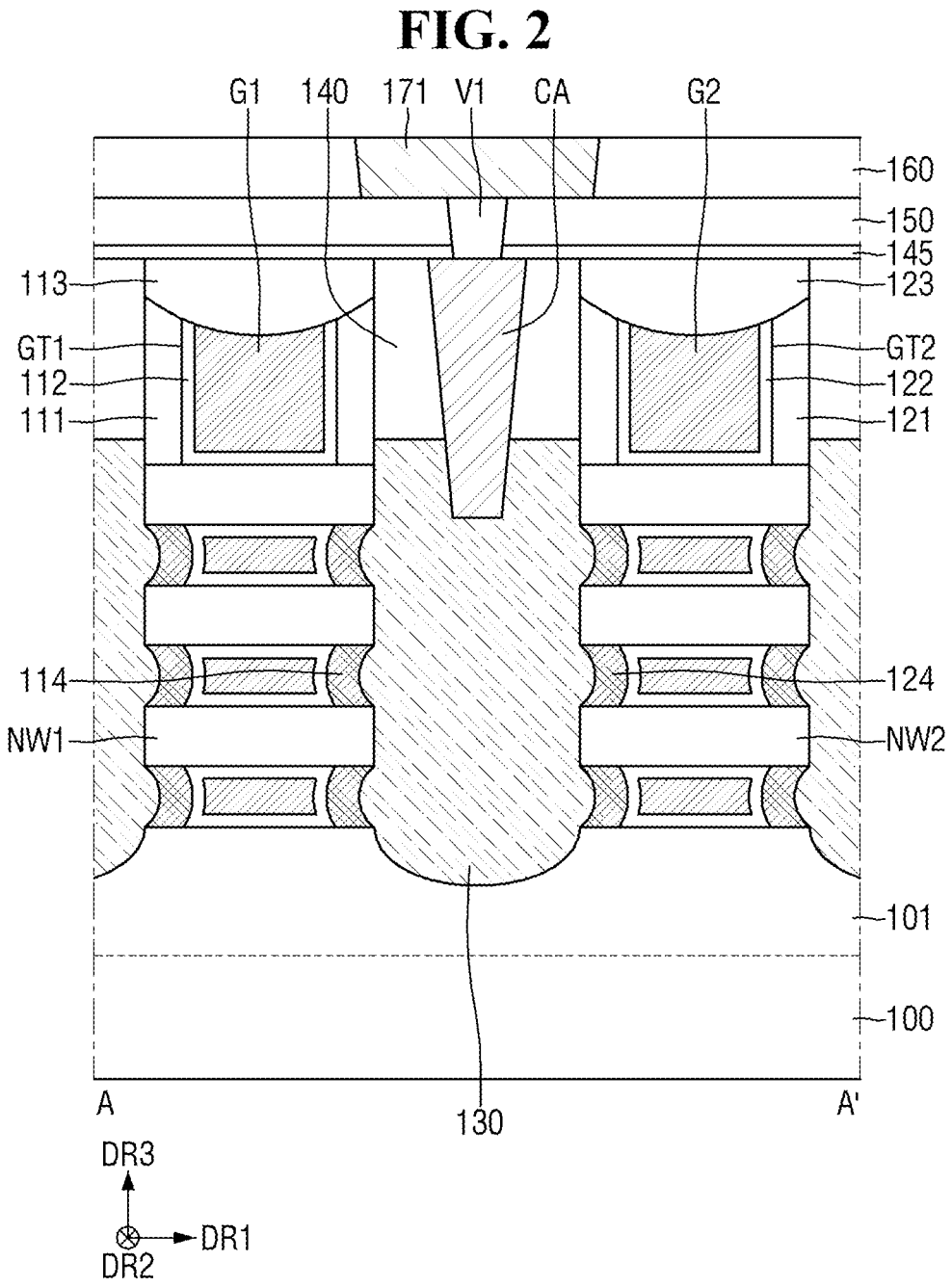
FIG. 2 is a cross-sectional view taken along line A-A' of FIG. 1.
Figure 3:
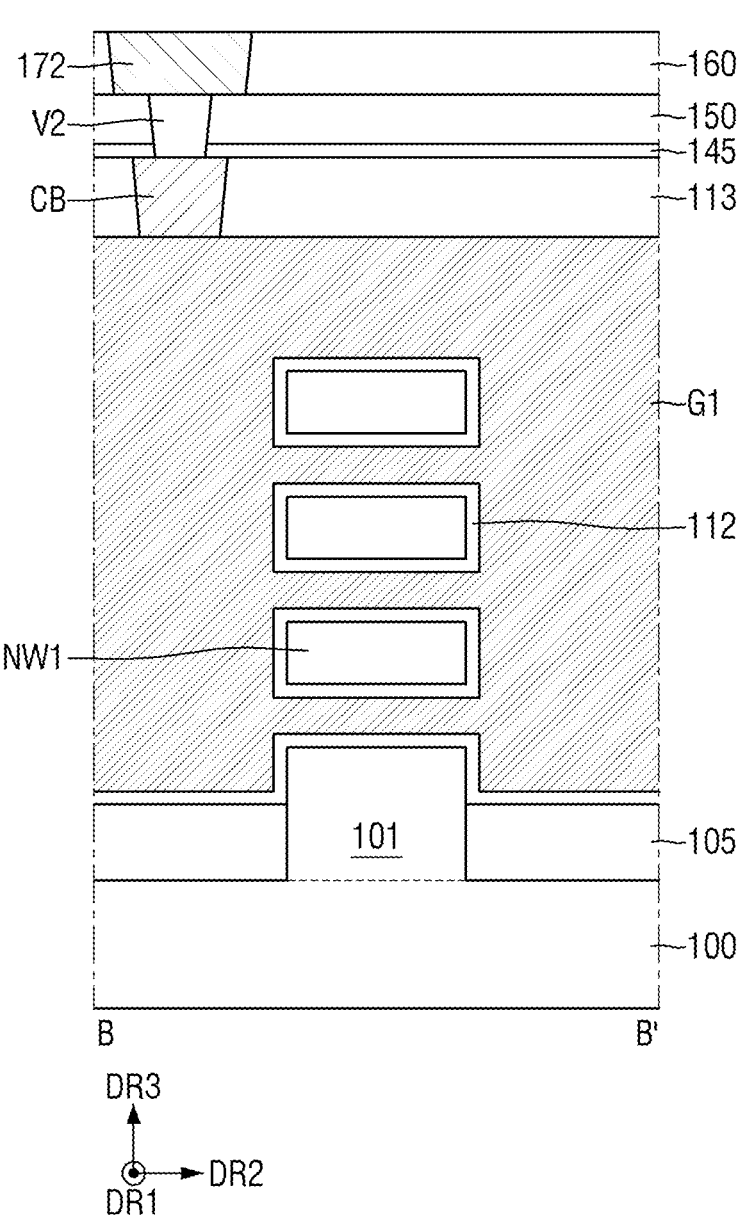
FIG. 3 is a cross-sectional view taken along line B-B' of FIG. 1.

Referring to FIGS. 1 to 3, a semiconductor device fabricated by a method according to some exemplary embodiments may include a substrate 100, an active pattern 101, a field insulating layer 105, first and second plurality of nanosheets NW1 and NW2, first and second gate electrodes G1 and G2, first and second gate spacers 111 and 121, first and second gate insulating layers 112 and 122, first and second capping patterns 113 and 123, first and second inner spacers 114 and 124, a source/drain region 130, a first interlayer insulating layer 140, a source/drain contact CA, a gate contact CB, an etching stop layer 145, a second interlayer insulating layer 150, first and second vias V1 and V2, a third interlayer insulating layer 160, and first and second wiring patterns 171 and 172.

The substrate 100 may be a silicon substrate or a silicon-on-insulator (SOI). In some alternative implementations, the substrate 100 may include silicon germanium, silicon germanium on insulator (SGOI), indium antimonide, a lead tellurium compound, indium arsenide, indium phosphide, gallium arsenide, or gallium antimonide, as non-limiting examples.

Hereinafter, each of a first horizontal direction DR1 and a second horizontal direction DR2 may be defined as a direction parallel to an upper surface of the substrate 100. A second horizontal direction DR2 may be defined as a direction different from the first horizontal direction DR1. A vertical direction DR3 may be defined as a direction perpendicular to each of the first horizontal direction DR1 and the second horizontal direction DR2.

The active pattern 101 may protrude from the substrate 100 in the vertical direction DR3. The active pattern 101 may be a portion of the substrate 100, and may include an epitaxial layer grown from the substrate 100. The active pattern 101 may extend in the first horizontal direction DR1.

The field insulating layer 105 may be disposed on the substrate 100. The field insulating layer 105 may surround a sidewall of the active pattern 101. For example, an upper surface of the active pattern 101 may further protrude in the vertical direction DR3 compared to an upper surface of the field insulating layer 105, as a non-limiting example. In some other exemplary embodiments, the upper surface of the active pattern 101 may be formed on the same plane as the upper surface of the field insulating layer 105.

The first plurality of nanosheets NW1 may be disposed on the active pattern 101. The first plurality of nanosheets NW1 may include a plurality of nanosheets stacked to be spaced apart from each other in the vertical direction DR3. For example, the first plurality of nanosheets NW1 may be spaced apart from the active pattern 101 in the vertical direction DR3. The second plurality of nanosheets NW2 may be disposed on the active pattern 101. The second plurality of nanosheets NW2 may be spaced apart from the first plurality of nanosheets NW1 in the first horizontal direction DR1. The second plurality of nanosheets NW2 may include a plurality of nanosheets stacked to be spaced apart from each other in the vertical direction DR3. For example, the second plurality of nanosheets NW2 may be spaced apart from the active pattern 101 in the vertical direction DR3.

Although FIGS. 2 and 3 illustrate that each of the first and second plurality of nanosheets NW1 and NW2 includes three nanosheets stacked in the vertical direction DR3, these figures are merely for convenience of explanation. In some implementations, each of the first and second plurality of nanosheets NW1 and NW2 may include three or more nanosheets stacked in the vertical direction DR3. Each of the first and second plurality of nanosheets NW1 and NW2 may include silicon (Si), as a non-limiting example. In some other exemplary embodiments, each of the first and second plurality of nanosheets NW1 and NW2 may include, for example, silicon germanium (SiGe). Hereinafter, it will be described as if each of the first and second plurality of nanosheets NW1 and NW2 includes silicon (Si).

The first gate spacer 111 may extend in the second horizontal direction DR2 on the uppermost nanosheet of the first plurality of nanosheets NW1 and the field insulating layer 105. The first gate spacer 111 may include two spacers that are spaced apart from each other in the first horizontal direction DR1. A first gate trench GT1 may be defined between the two spacers of the first gate spacer 111.

The second gate spacer 121 may extend in the second horizontal direction DR2 on the uppermost nanosheet of the second plurality of nanosheets NW2 and the field insulating layer 105. The second gate spacer 121 may include two spacers spaced apart from each other in the first horizontal direction DR1. A second gate trench GT2 may be defined between the two spacers of the second gate spacer 121.

Each of the first gate spacer 111 and the second gate spacer 121 may include, for example, at least one of silicon nitride (SiN), silicon oxynitride (SiON), silicon oxide (SiO$_2$), silicon carbonitride (SiCN), silicon oxycarbonitride (SiOCN), silicon oxycarbide (SiOC), silicon boron nitride (SiBN), silicon oxyboron nitride (SiOBN), silicon boron carbon nitride (SiBCN), and a combination thereof.

The first gate electrode G1 may extend in the second horizontal direction DR2 on the active pattern 101 and the field insulating layer 105. The first gate electrode G1 may be disposed inside the first gate trench GT1. The first gate electrode G1 may surround the first plurality of nanosheets NW1. The second gate electrode G2 may extend in the second horizontal direction DR2 on the active pattern 101 and the field insulating layer 105. The second gate electrode G2 may be spaced apart from the first gate electrode G1 in the first horizontal direction DR1. The second gate electrode G2 may be disposed inside the second gate trench GT2. The second gate electrode G2 may surround the second plurality of nanosheets NW2.

Each of the first gate electrode G1 and the second gate electrode G2 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TIC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof. Each of the first gate electrode G1 and the second gate electrode G2 may include a conductive metal oxide, a conductive metal oxynitride, or the like, and may include an oxidized form of the above-described materials.

The source/drain region 130 may be disposed on at least one side of the first gate electrode G1 on the active pattern 101. In addition, the source/drain region 130 may be disposed on at least one side of the second gate electrode G2 on the active pattern 101. For example, the source/drain region 130 may be disposed on both sides of each of the first gate electrode G1 and the second gate electrode G2 on the active pattern 101. For example, the source/drain region 130 may be in contact with sidewalls of the first plurality of nanosheets NW1 in the first horizontal direction DR1. In addition, the source/drain region 130 may be in contact with sidewalls of the second plurality of nanosheets NW2 in the first horizontal direction DR1.

The first gate insulating layer 112 may be disposed along a sidewall and a bottom surface of the first gate trench GT1. The first gate insulating layer 112 may be disposed between the first gate electrode G1 and the first gate spacer 111 in the first gate trench GT1. The first gate insulating layer 112 may be disposed between the first gate electrode G1 and the field insulating layer 105. The first gate insulating layer 112 may be disposed between the first gate electrode G1 and the first plurality of nanosheets NW1. The first gate insulating layer 112 may be disposed between the first gate electrode G1 and the active pattern 101. The first gate insulating layer 112 may be disposed between the first gate electrode G1 and the source/drain region 130.

The second gate insulating layer 122 may be disposed along a sidewall and a bottom surface of the second gate trench GT2. The second gate insulating layer 122 may be disposed between the second gate electrode G2 and the second gate spacer 121 in the second gate trench GT2. The second gate insulating layer 122 may be disposed between the second gate electrode G2 and the field insulating layer 105. The second gate insulating layer 122 may be disposed between the second gate electrode G2 and the second plurality of nanosheets NW2. The second gate insulating layer 122 may be disposed between the first gate electrode G2 and the active pattern 101. The second gate insulating layer 122 may be disposed between the second gate electrode G2 and the source/drain region 130.

Each of the first gate insulating layer 112 and the second gate insulating layer 122 may include at least one of silicon oxide, silicon oxynitride, silicon nitride, or a high-k material having a dielectric constant greater than that of silicon oxide. The high-k material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some other exemplary embodiments may include a negative capacitance (NC) field effect transistor (FET) using a negative capacitor. For example, each of the first gate insulating layer 112 and the second gate insulating layer 122 may include a ferroelectric material film having ferroelectric characteristics and a paraelectric material film having paraelectric characteristics.

The ferroelectric material layer may have a negative capacitance, and the paraelectric material layer may have a positive capacitance. For example, when two or more capacitors are connected in series with each other and the capacitance of each capacitor has a positive value, a total capacitance decreases as compared with a capacitance of each individual capacitor. On the other hand, when at least one of the capacitances of two or more capacitors connected in series with each other has a negative value, the total capacitance may be greater than an absolute value of each individual capacitance while having a positive value.

When the ferroelectric material layer having the negative capacitance and the paraelectric material layer having the positive capacitance are connected in series with each other, a total capacitance value of the ferroelectric material layer and the paraelectric material layer connected in series with each other may increase. A transistor including the ferroelectric material film may have a subthreshold swing (SS) less than 60 m V/decade at room temperature, using the increase in the total capacitance value.

The ferroelectric material layer may have the ferroelectric characteristics. The ferroelectric material layer may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may also be a compound of hafnium (Hf), zirconium (Zr), and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material layer may vary depending on a type of ferroelectric material included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include 3 to 8 atomic % (at %) of aluminum. Here, a ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may contain 1 to 7 at % of gadolinium. When the dopant is zirconium (Zr), the ferroelectric material layer may include 50 to 80 at % of zirconium.

The paraelectric material layer may have paraelectric characteristics. The paraelectric material layer may include, for example, at least one of silicon oxide and metal oxide having a high dielectric constant. The metal oxide included in the paraelectric material layer may include, for example, at least one of hafnium oxide, zirconium oxide, and aluminum oxide, as non-limiting examples.

The ferroelectric material layer and the paraelectric material layer may include the same material. The ferroelectric material layer may have ferroelectric characteristics, but the paraelectric material layer may not have ferroelectric characteristics. For example, when the ferroelectric material layer and the paraelectric material layer include hafnium oxide, a crystal structure of the hafnium oxide included in the ferroelectric material layer may be different from a crystal structure of the hafnium oxide included in the paraelectric material layer.

The ferroelectric material layer may have a thickness that provides the ferroelectric characteristics. The thickness of the ferroelectric material layer may be, for example, 0.5 to 10 nm, as non-limiting examples. A critical thickness providing the ferroelectric characteristics may vary for each ferroelectric material. Accordingly, the thickness of the ferroelectric material layer may vary depending on the particular ferroelectric material.

As an example, each of the first gate insulating layer 112 and the second gate insulating layer 122 may include one ferroelectric material film. As another example, each of the first gate insulating layer 112 and the second gate insulating layer 122 may include a plurality of ferroelectric material films spaced apart from each other. Each of the first gate insulating layer 112 and the second gate insulating layer 122 may have a stacked film structure in which a plurality of ferroelectric material films and a plurality of paraelectric material films are alternately stacked.

The first capping pattern 113 may extend in the second horizontal direction DR2 on the first gate electrode G1 and the first gate spacer 111. For example, the first capping pattern 113 may be in contact with an upper surface of the first gate spacer 111. The second capping pattern 123 may extend in the second horizontal direction DR2 on the second gate electrode G2 and the second gate spacer 121. The second capping pattern 123 may be in contact with an upper surface of the second gate spacer 121.

In some exemplary embodiments, the first capping pattern 113 may be disposed between the first gate spacers 111. In this case, an upper surface of the first capping pattern 113 may be formed on the same plane as the upper surface of the first gate spacer 111. In addition, the second capping pattern 123 may be disposed between the second gate spacers 121. In this case, an upper surface of the second capping pattern 123 may be formed on the same plane as the upper surface of the second gate spacer 121. Each of the first capping pattern 113 and the second capping pattern 123 may include, for example, at least one of silicon nitride (SiN), silicon oxynitride (SiON), silicon oxide ($SiO_2$), silicon carbonitride (SiCN), silicon oxycarbonitride (SiOCN), and a combination thereof.

The first inner spacer 114 may be disposed between the respective nanosheets of the first plurality of nanosheets NW1. The first inner spacer 114 may be disposed between the active pattern 101 and the lowest nanosheet of the first plurality of nanosheets NW1. The first inner spacer 114 may be disposed on both sides of the first gate electrode G1 in the first horizontal direction DR1. The first inner spacer 114 may be disposed between the first gate electrode G1 and the source/drain region 130. For example, the first inner spacer 114 may be in contact with the uppermost surface of the active pattern 101, the first inner spacer 114 may be in contact with the first gate insulating layer 112, and the first inner spacer 114 may be in contact with the first plurality of nanosheets NW1.

The second inner spacer 124 may be disposed between the respective nanosheets of the second plurality of nanosheets NW2. The second inner spacer 124 may be disposed between the active pattern 101 and the lowest nanosheet of the second plurality of nanosheets NW2. The second inner spacer 124 may be disposed on both sides of the second gate electrode G2 in the first horizontal direction DR1. The second inner spacer 124 may be disposed between the second gate electrode G2 and the source/drain region 130. For example, the second inner spacer 124 may be in contact with the uppermost surface of the active pattern 101. The second inner spacer 124 may be in contact with the second gate insulating layer 122. The second inner spacer 124 may be in contact with the second plurality of nanosheets NW2.

A sidewall of the first inner spacer 114 facing the first gate electrode G1 may be formed to be convex toward the first gate electrode G1. A sidewall of the first inner spacer 114 in contact with the source/drain region 130 may be formed to be convex toward the first gate electrode G1. In addition, a sidewall of the second inner spacer 124 facing the second gate electrode G2 may be formed to be convex toward the second gate electrode G2. A sidewall of the second inner spacer 124 in contact with the source/drain region 130 may be formed to be convex toward the second gate electrode G2.

Each of the first inner spacer 114 and the second inner spacer 124 may include, for example, at least one of silicon nitride (SiN), silicon oxynitride (SiON), silicon carbonitride (SiCN), silicon oxycarbonitride (SiOCN), silicon boron nitride (SiBN), silicon oxyboronitride (SiOBN), silicon boron carbon nitride (SiBCN), and a combination thereof.

The first interlayer insulating layer 140 may be formed on the field insulating layer 105. The first interlayer insulating layer 140 may cover the source/drain region 130. The first interlayer insulating layer 140 may surround the sidewall of the first gate spacer 111 and the sidewall of the second gate spacer 121. The first interlayer insulating layer 140 may surround a sidewall of the first capping pattern 113 and a sidewall of the second capping pattern 123. For example, an upper surface of the first interlayer insulating layer 140 may be formed on the same plane as each of an upper surface of the first capping pattern 113 and an upper surface of the second capping pattern 123, as non-limiting examples. In some other exemplary embodiments, the first interlayer insulating layer 140 may cover each of the upper surfaces of the first capping pattern 113 and the upper surface of the second capping pattern 123.

The first interlayer insulating layer 140 may include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutoxysiloxane (DADBS), trimethylsilyl phosphate (TMSP), polytetrafluoroethylene (PTFE), Tonen Silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, as non-limiting examples.

For example, the source/drain contact CA may penetrate through the first interlayer insulating layer 140 in the vertical direction DR3 to be connected to the source/drain region 130. Although not illustrated in FIG. 2, a silicide layer may be formed between the source/drain contact CA and the source/drain region 130. For example, an upper surface of the source/drain contact CA may be formed on the same plane as the upper surface of the first interlayer insulating layer 140, as non-limiting examples. Although it is illustrated in FIG. 2 that the source/drain contact CA is formed as a single film, this is for convenience of explanation and the present disclosure is not limited thereto. That is, the source/drain contact CA may be formed as multiple films. The source/drain contact CA may include a conductive material.

For example, the gate contact CB may penetrate through the first capping pattern 113 in the vertical direction DR3 and may be connected to the first gate electrode G1. For example, an upper surface of the gate contact CB may be formed on the same plane as the upper surface of the first interlayer insulating layer 140, as non-limiting examples. Although it is illustrated in FIG. 3 that the gate contact CB is formed as a single film, this is a non-limiting example for convenience of explanation. That is, the gate contact CB may be formed as multiple films. The gate contact CB may include a conductive material.

The etching stop layer 145 may be disposed on the upper surface of each of the first interlayer insulating layer 140, the first capping pattern 113, the second capping pattern 123, the source/drain contact CA, and the gate contact CB. The etching stop layer 145 may be conformally formed, for example. Although it is illustrated in FIGS. 2 and 3 that the etching stop layer 145 is formed as a single film n some exemplary embodiments, the etching stop layer 145 may be formed as multiple films. The etching stop layer 145 may include, for example, at least one of aluminum oxide, aluminum nitride, hafnium oxide, zirconium oxide, silicon oxide, silicon nitride, silicon oxynitride, and a low-k material.

The second interlayer insulating layer 150 may be disposed on the etching stop layer 145. The second interlayer insulating layer 150 may include, for example, at least one of silicon oxide, silicon nitride, silicon oxynitride, and a low-k material. The first via V1 may penetrate through the second interlayer insulating layer 150 and the etching stop layer 145 in the vertical direction DR3 and may be connected to the source/drain contact CA. The second via V2 may penetrate through the second interlayer insulating layer 150 and the etching stop layer 145 in the vertical direction DR3 and may be connected to the gate contact CB. Although it is illustrated in FIGS. 2 and 3 that each of the first via V1 and the second via V2 is formed as a single film, in some implementations, each of the first via V1 and the second via V2 may be formed as multiple films. Each of the first via V1 and the second via V2 may include a conductive material.

The third interlayer insulating layer 160 may be disposed on the second interlayer insulating layer 150. The third interlayer insulating layer 160 may include, for example, at least one of silicon oxide, silicon nitride, silicon oxynitride, and a low-k material. Each of the first wiring pattern 171 and the second wiring pattern 172 may be disposed in the third interlayer insulating layer 160. The first wiring pattern 171 may be electrically connected to the source/drain contact CA through the first via V1. For example, the first wiring pattern 171 may be a power rail. The second wiring pattern 172 may be electrically connected to the gate contact CB through the second via V2. Although it is illustrated in FIGS. 2 and 3 that each of the first wiring pattern 171 and the second wiring pattern 172 is formed as a single film, in some implementations, each of the first wiring pattern 171 and the second wiring pattern 172 may be formed as multiple films. Each of the first wiring pattern 171 and the second wiring pattern 172 may include a conductive material.

Hereinafter, a method for fabricating a semiconductor device according to some exemplary embodiments will be described with reference to FIGS. 2 to 22.

FIGS. 4 to 22 are intermediate step views for describing a method for fabricating a semiconductor device according to some exemplary embodiments of the present disclosure. FIG. 12 is an enlarged view of region R1 of FIG. 11. FIG. 13 is an enlarged view of region R2 of FIG. 11. FIG. 15 is an enlarged view of region R3 of FIG. 14. FIG. 16 is an enlarged view of region R4 of FIG. 14.

Figure 4:
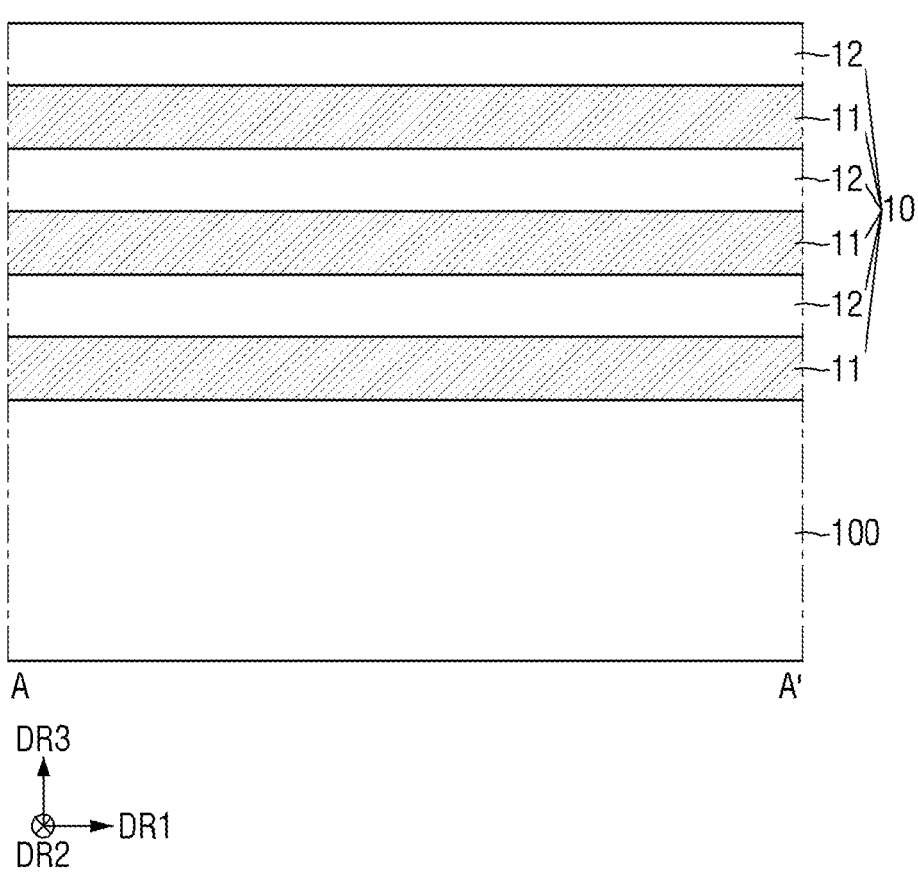

Referring to FIG. 4, a stacked structure 10 may be formed on a substrate 100. The stacked structure 10 may include a sacrificial layer 11 and a semiconductor layer 12 alternately stacked on the substrate 100. For example, the sacrificial layer 11 may be formed on the lowermost portion of the stacked structure 10, and the semiconductor layer 12 may be formed on the uppermost portion of the stacked structure 10, as non-limiting examples. In some other exemplary embodiments, the sacrificial layer 11 may also be formed on the uppermost portion of the stacked structure 10. The sacrificial layer 11 may include, for example, silicon germanium (SiGe). The semiconductor layer 12 may include, for example, silicon (Si).

Figure 5:
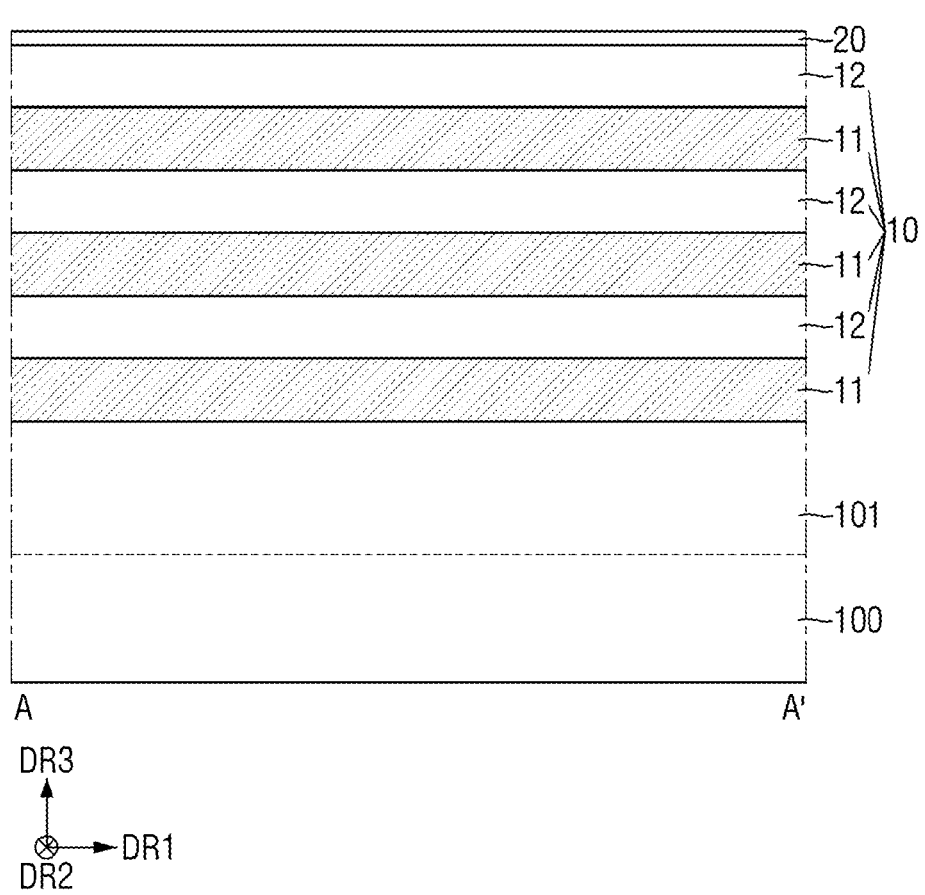
Figure 6:
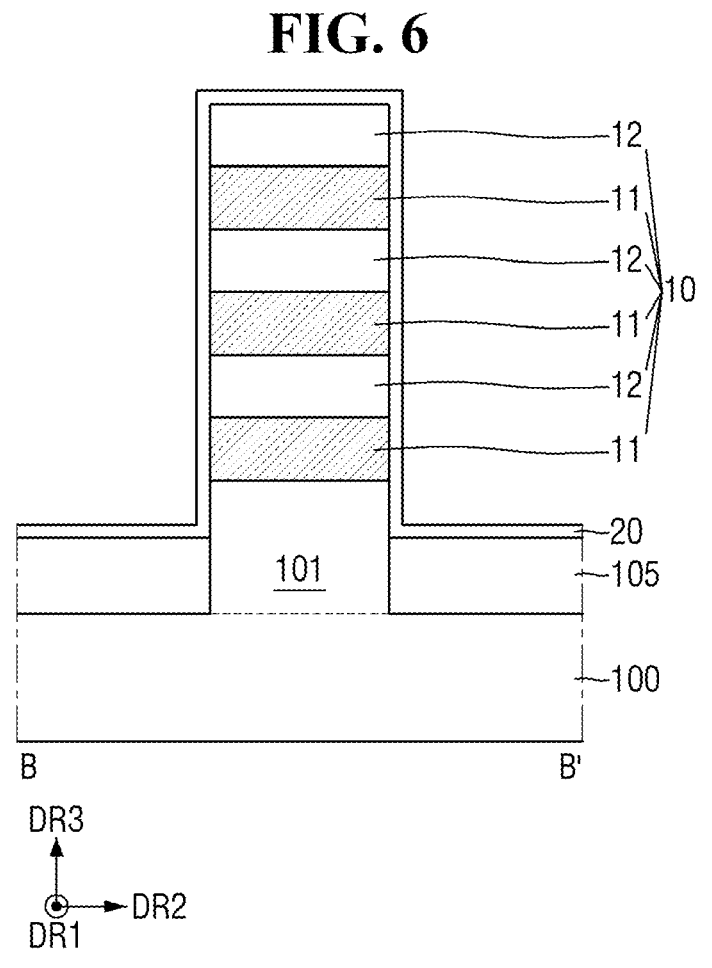

Referring to FIGS. 5 and 6, a portion of the stacked structure 10 may be etched. While the stacked structure 10 is etched, a portion of the substrate 100 may also be etched. Through such an etching process, an active pattern 101 may be defined on the substrate 100 on a lower side of the stacked structure 10. The active pattern 101 may extend in the first horizontal direction DR1.

Subsequently, a field insulating layer 105 surrounding a sidewall of the active pattern 101 may be formed. For example, an upper surface of the active pattern 101 may be formed to be higher than an upper surface of the field insulating layer 105. Subsequently, a pad oxide layer 20 may be formed to cover the upper surface of the field insulating layer 105, the exposed sidewall of the active pattern 101, and the sidewall and upper surface of the stacked structure 10. For example, the pad oxide layer 20 may be conformally formed. The pad oxide layer 20 may include, for example, silicon oxide ($SiO_2$).

Figure 7:
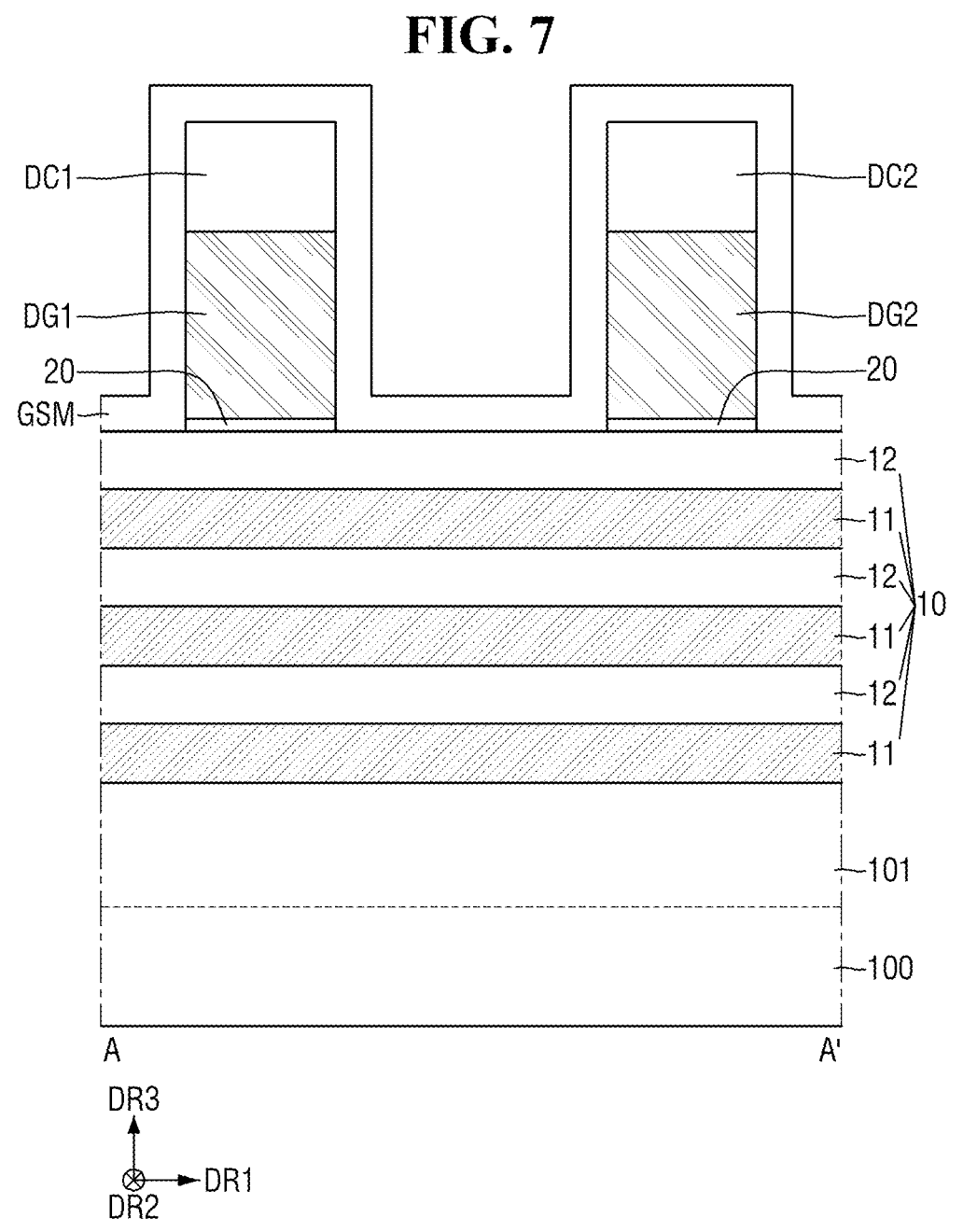
Figure 8:
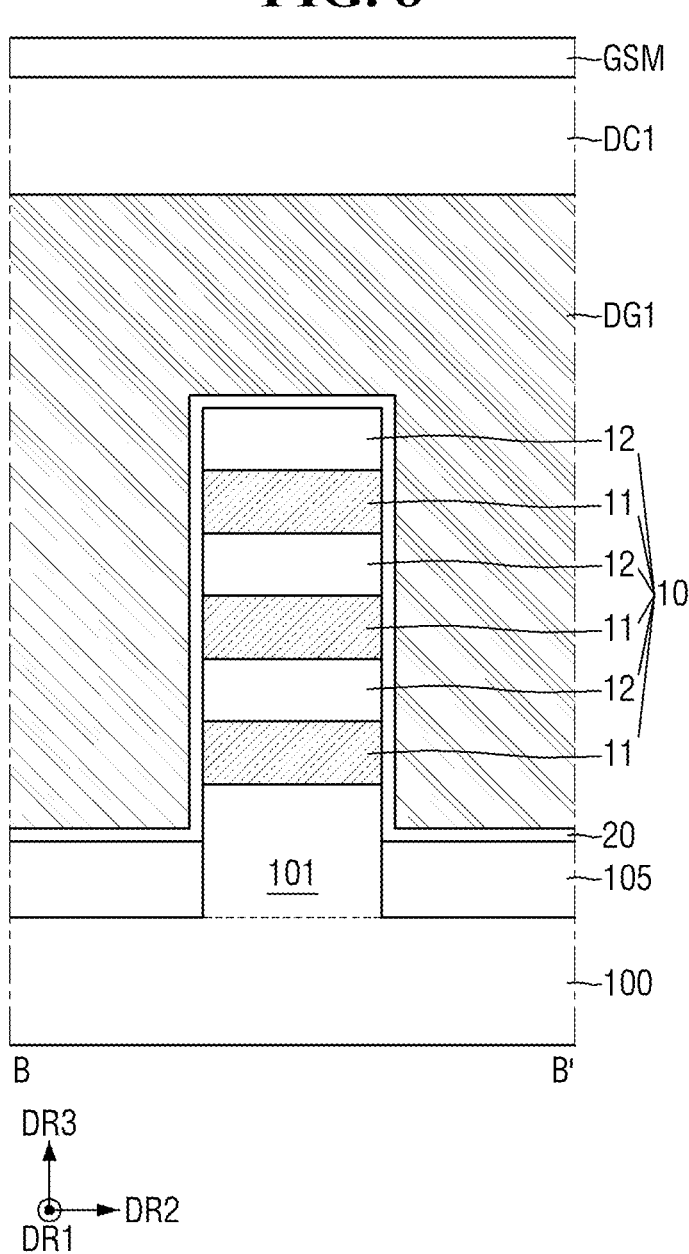

Referring to FIGS. 7 and 8, first and second dummy gates DG1 and DG2 and first and second dummy capping patterns DC1 and DC2 extending in the second horizontal direction DR2 may be formed on the pad oxide layer 20 on the stacked structure 10 and the field insulating layer 105. The first dummy capping pattern DC1 may be formed on the first dummy gate DG1. The second dummy capping pattern DC2 may be formed on the second dummy gate DG2. The second dummy gate DG2 and the second dummy capping pattern DC2 may be spaced apart from the first dummy gate DG1 and the first dummy capping pattern DC1 in the first horizontal direction DR1. While the first and second dummy gates DG1 and DG2 and the first and second dummy capping patterns DC1 and DC2 are formed, the remaining pad oxide layer 20 except for a portion overlapping each of the first and second dummy gates DG1 and DG2 on the substrate 100 in the vertical direction DR3 may be removed.

Subsequently, a gate spacer material layer GSM may be formed to cover a sidewall of each of the first and second dummy gates DG1 and DG2, a sidewall and an upper surface of each of the first and second dummy capping patterns DC1 and DC2, and the exposed sidewall and upper surface of the stacked structure 10. Although not illustrated, the gate spacer material layer GSM may also be formed on the exposed upper surface of the field insulating layer 105. For example, the gate spacer material layer GSM may be conformally formed. The gate spacer material layer GSM may include, for example, at least one of silicon nitride (SiN), silicon oxynitride (SiON), silicon oxide ($SiO_2$), silicon carbonitride (SiCN), silicon oxycarbonitride (SiOCN), silicon oxycarbide (SiOC), silicon boron nitride (SiBN), silicon oxyboron nitride (SiOBN), silicon boron carbon nitride (SiBCN), and a combination thereof.

Figure 9:
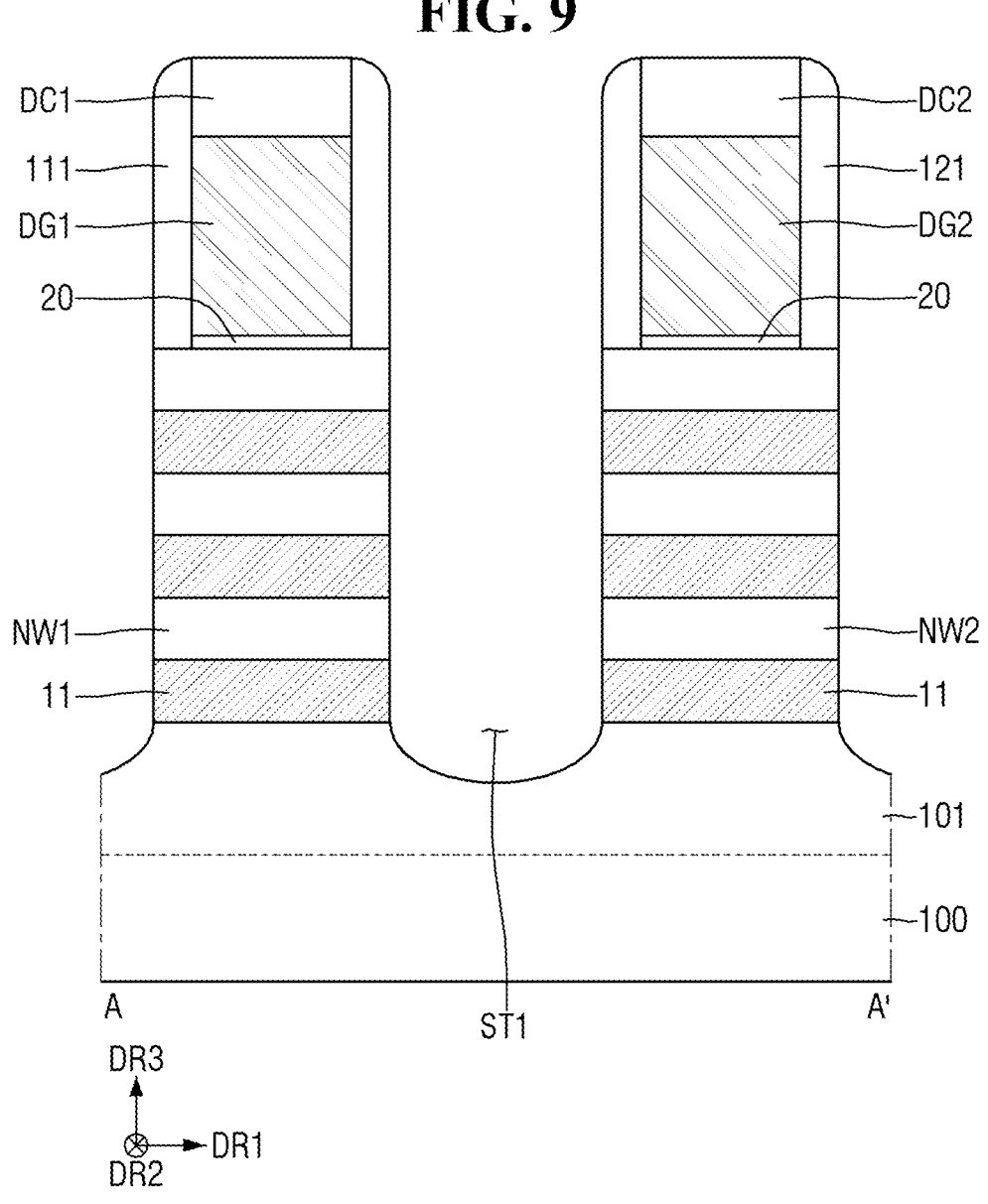

Referring to FIG. 9, a first source/drain trench ST1 may be formed by etching the stacked structure (10 in FIG. 7) using the first and dummy gates DG1 and DG2 and the first and second dummy capping patterns DC1 and DC2 as a mask. For example, the first source/drain trench ST1 may extend into the active pattern 101.

While the first source/drain trench ST1 is formed, the gate spacer material layer (GSM in FIG. 7) formed on the upper surface of each of the first and second dummy capping patterns DC1 and DC2 may be removed. The gate spacer material layer (GSM in FIG. 7) remaining on the sidewall of each of the first dummy gate DG1 and the first dummy capping pattern DC1 may be defined as a first gate spacer 111. In addition, the gate spacer material layer (GSM in FIG. 7) remaining on the sidewall of each of the second dummy gate DG2 and the second dummy capping pattern DC2 may be defined as a second gate spacer 121.

After the first source/drain trench ST1 is formed, the semiconductor layer (12 in FIG. 7) remaining on a lower side of the first dummy gate DG1 may be defined as a first plurality of nanosheets NW1. In addition, after the first source/drain trench ST1 is formed, the semiconductor layer (12 in FIG. 7) remaining on a lower side of the second dummy gate DG2 may be defined as a second plurality of nanosheets NW2.

Figure 10:
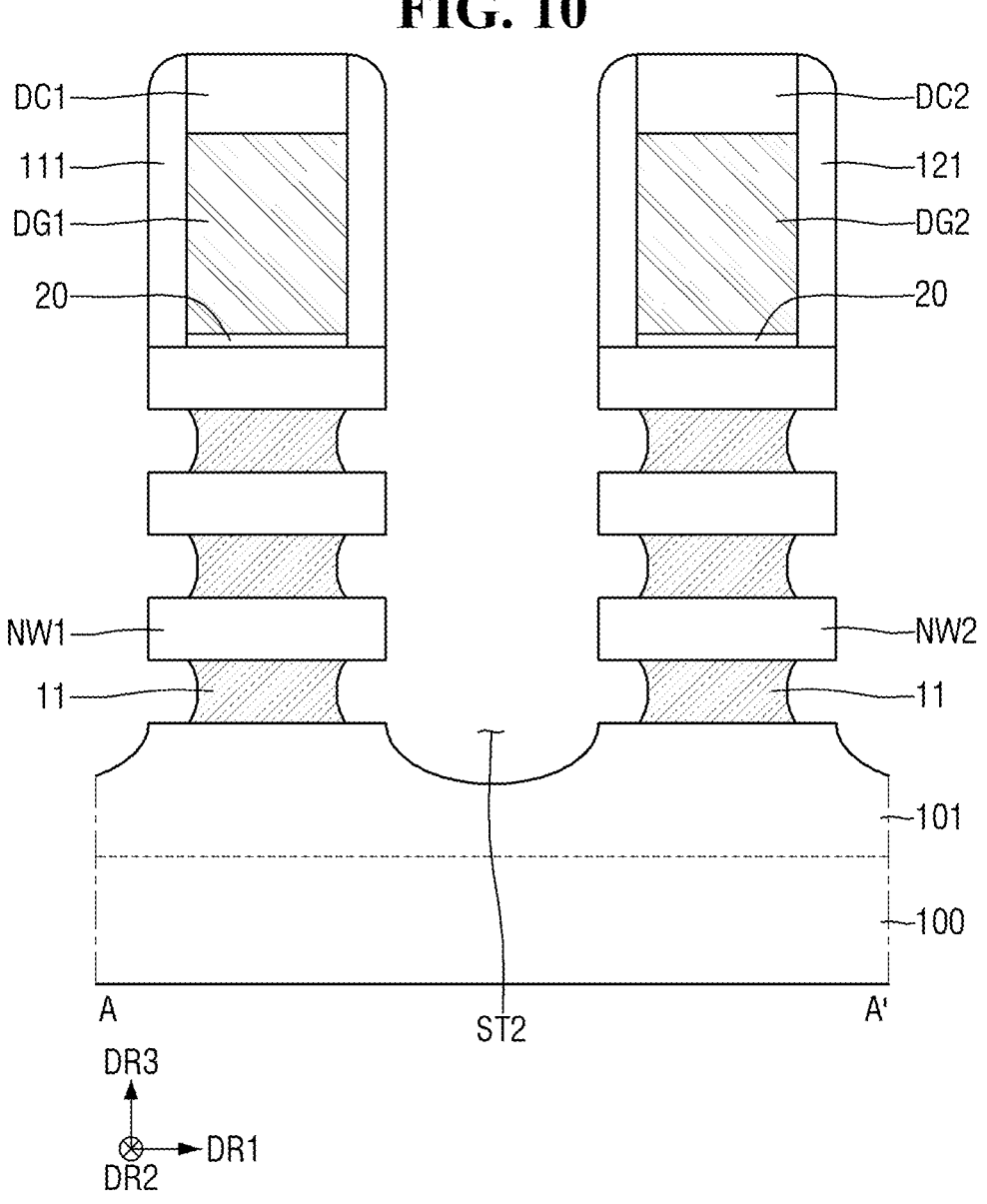

Referring to FIG. 10, a portion of a sidewall of the sacrificial layer 11 exposed to the first source/drain trench ST1 may be etched. Accordingly, a second source/drain trench ST2 may be formed between the first plurality of nanosheets NW1 and the second plurality of nanosheets NW2 on the active pattern 101. Here, the second source/drain trench ST2 may be defined as further including a portion in which a portion of the sidewall of the sacrificial layer 11 is etched in the first source/drain trench ST1. For example, a portion of the sidewall of the sacrificial layer 11 may be etched by a wet etching process.

Figure 11:
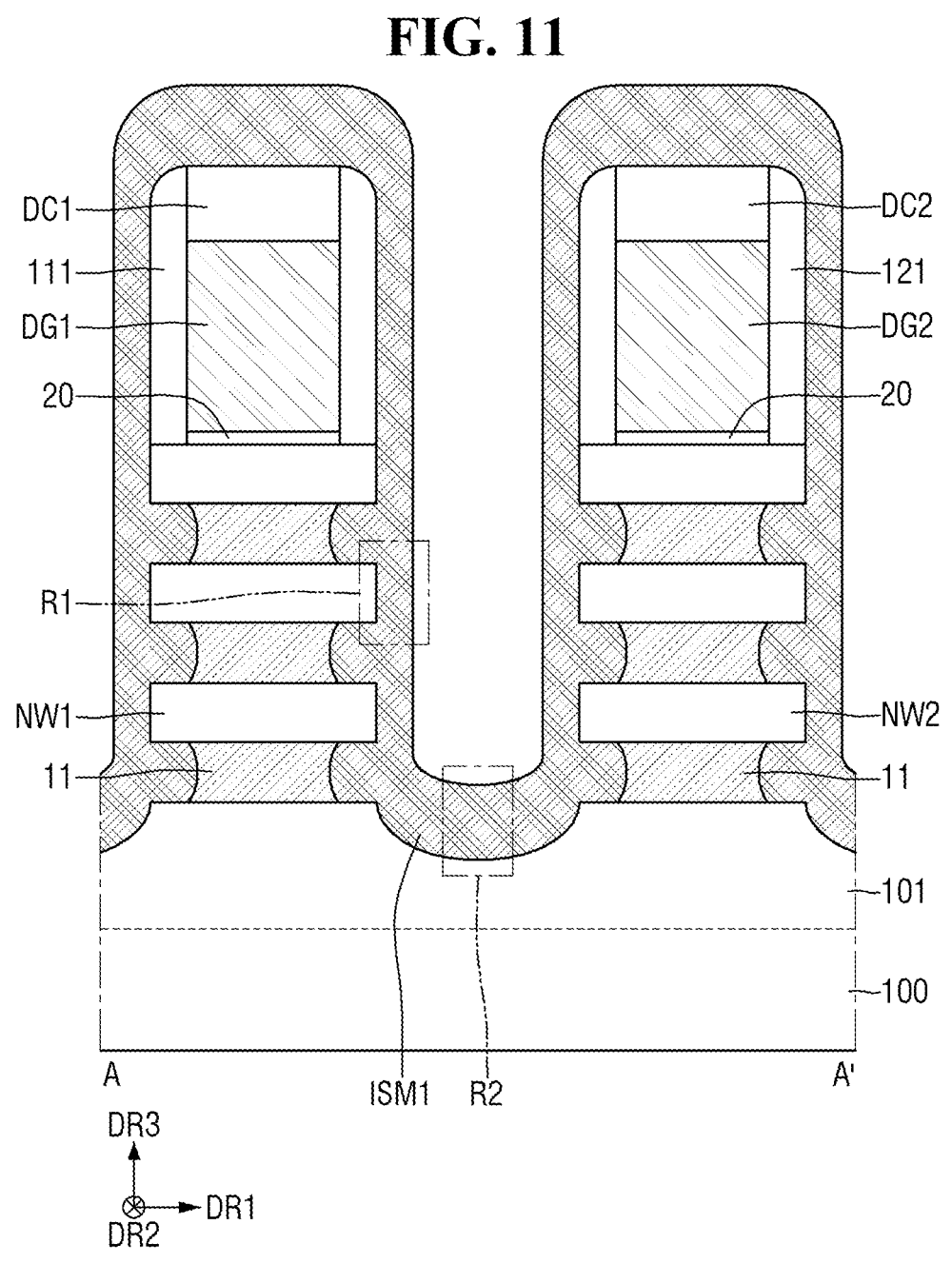
Figure 12:
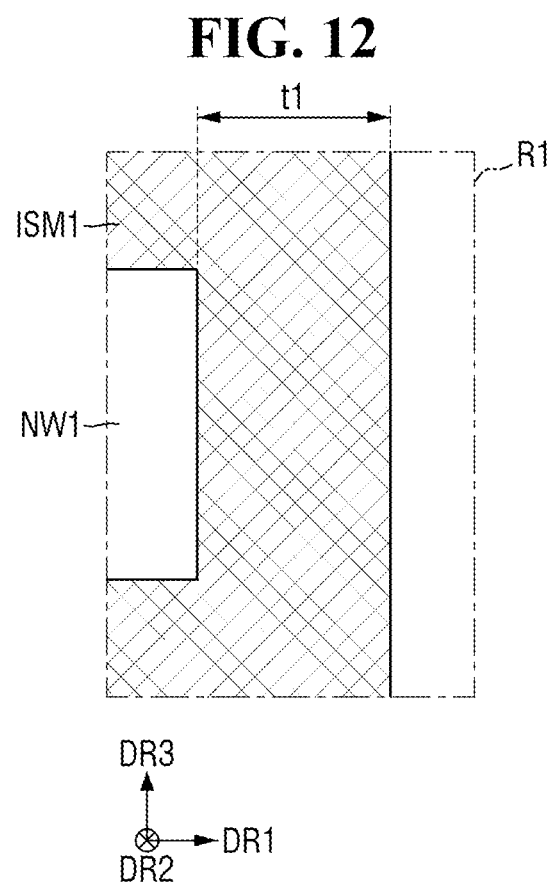
Figure 13:
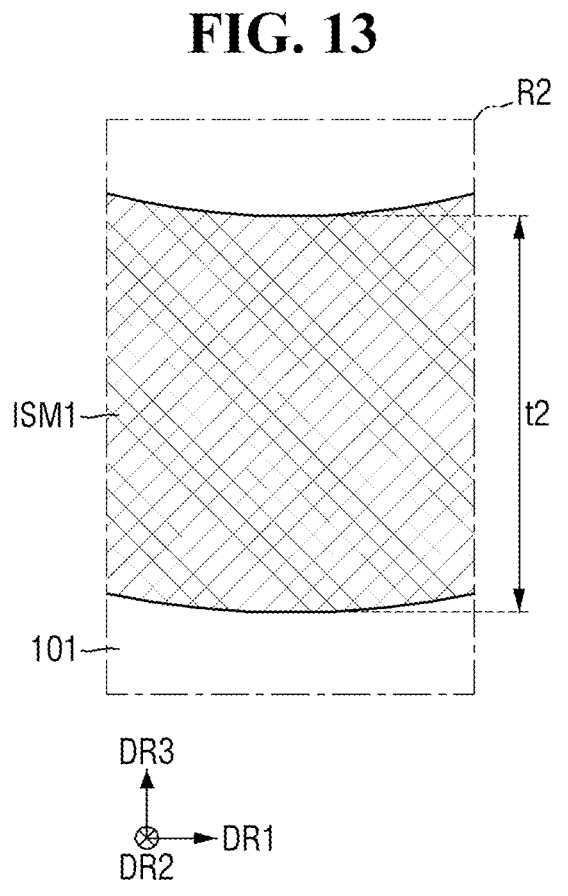

Referring to FIGS. 11 to 13, a first inner spacer material layer ISM1 may be formed along a sidewall and a bottom surface of the second source/drain trench (ST2 in FIG. 10). The first inner spacer material layer ISM1 may be in contact with each other of the upper surface of the active pattern 101, the sidewall of the first plurality of nanosheets NW1, the sidewall of the second plurality of nanosheets NW2, and the sidewall of the sacrificial layer 11 that are exposed to the second source/drain trench (ST2 in FIG. 10).

For example, the first inner spacer material layer ISM1 may also be formed on each of the sidewall of the first gate spacer 111, the sidewall of the second gate spacer 121, the upper surface of the first dummy capping pattern DC1, and the upper surface of the second dummy capping pattern DC2. The first inner spacer material layer ISM1 may be in contact with each of the sidewall of the first gate spacer 111, the sidewall of the second gate spacer 121, the upper surface of the first dummy capping pattern DC1, and the upper surface of the second dummy capping pattern DC2.

For example, a thickness t1 of the first inner spacer material layer ISM1 formed on the sidewall of the first plurality of nanosheets NW1 in the first horizontal direction DR1 may be smaller than a thickness t2 of the first inner spacer material layer ISM1 formed on the active pattern 101 inside the second source/drain trench (ST2 in FIG. 10) in the vertical direction DR3. For example, the thickness t1 of the first inner spacer material layer ISM1 formed on the sidewall of the first plurality of nanosheets NW1 in the first horizontal direction DR1 may be smaller than a thickness of the first inner spacer material layer ISM1 formed on the upper surface of the first dummy capping pattern DC1 in the vertical direction DR3.

The first inner spacer material layer ISM1 may include, for example, at least one of silicon nitride (SiN), silicon oxynitride (SiON), silicon carbonitride (SiCN), silicon oxycarbonitride (SiOCN), silicon boron nitride (SiBN), silicon oxyboron nitride (SiOBN), silicon boron carbon nitride (SiBCN), and combinations thereof.

Figure 14:
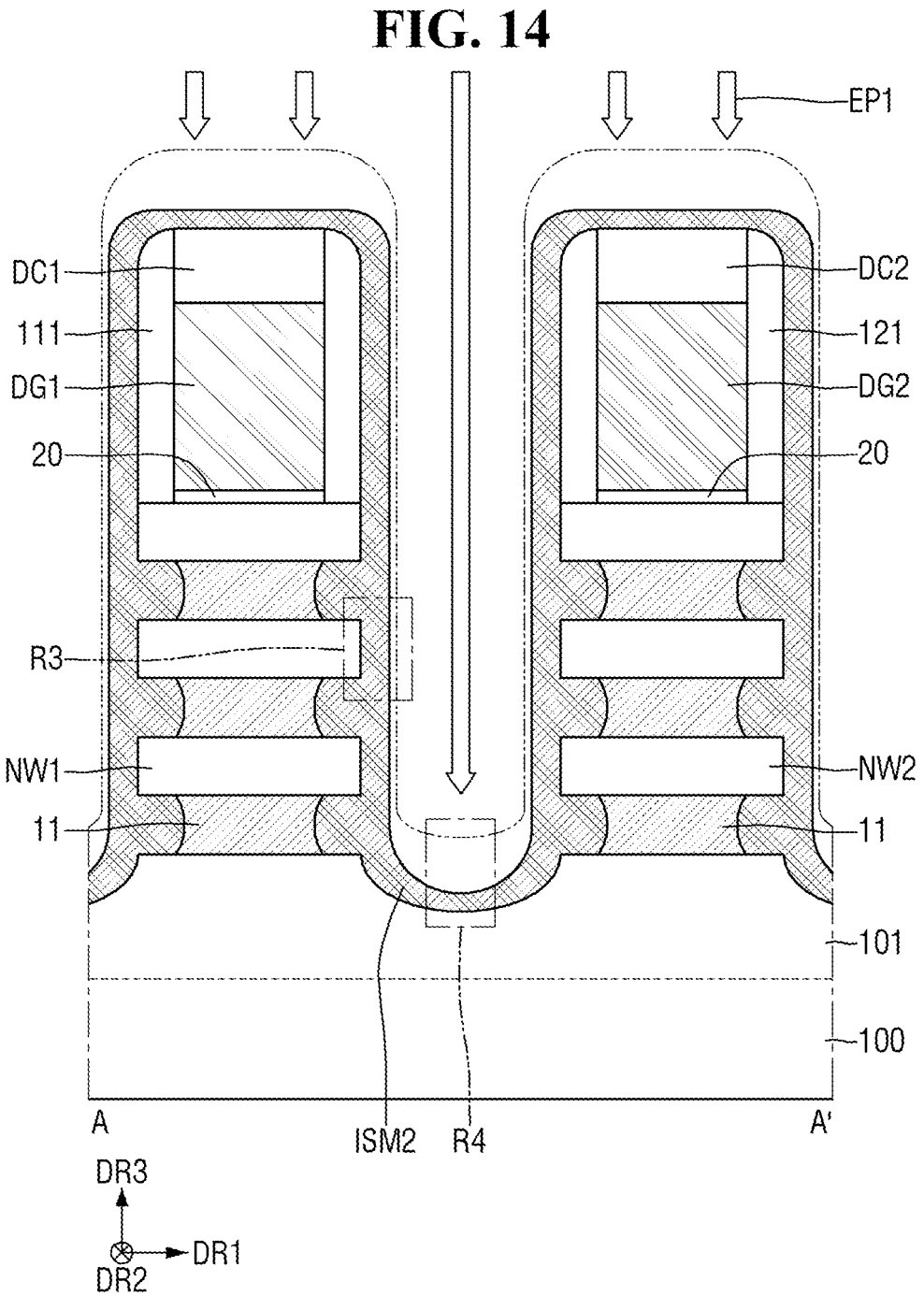
Figure 15:
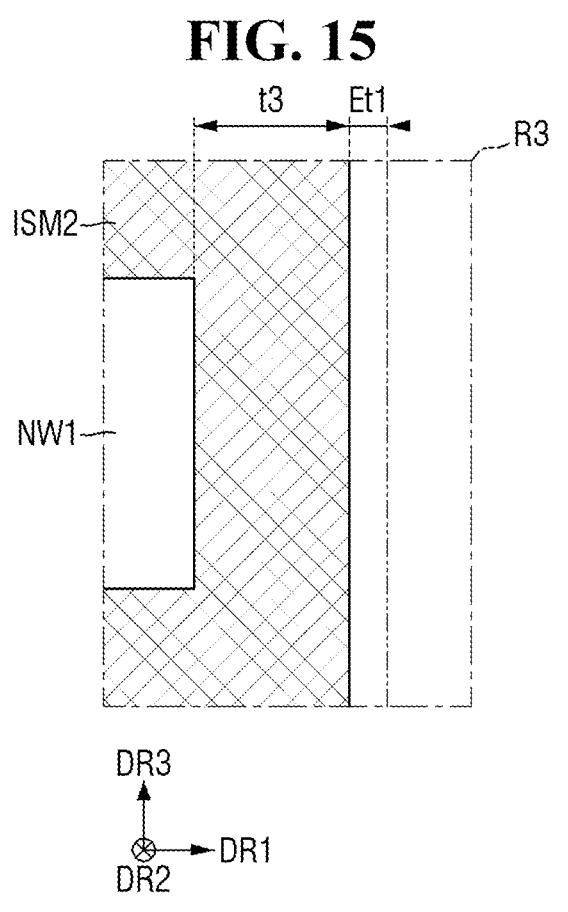
Figure 16:
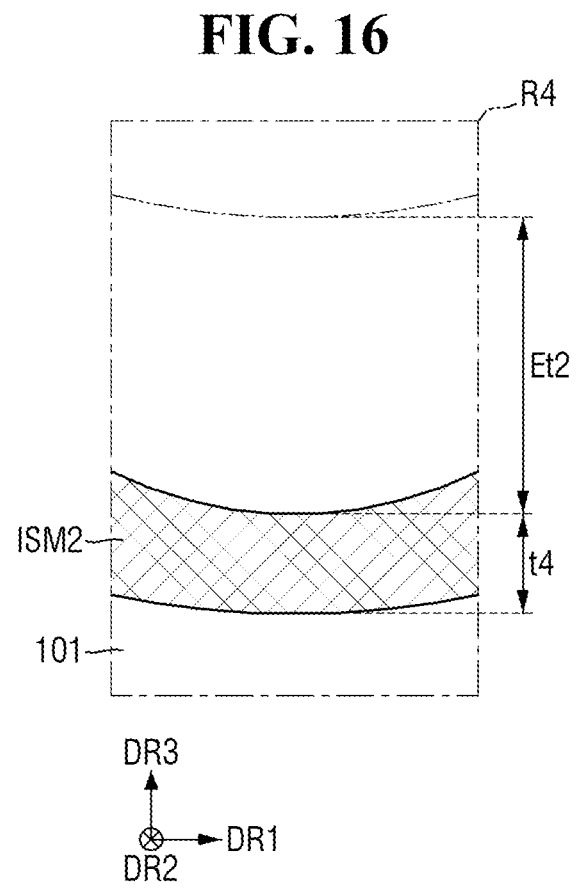

Referring to FIGS. 14 to 16, a portion of the first inner spacer material layer (ISM1 in FIG. 11) exposed by performing a first etching process EP1 may be etched to form a second inner spacer material layer ISM2. The second inner spacer material layer ISM2 may be defined as a first inner spacer material layer (ISM1 in FIG. 11) remaining after a portion of the first inner spacer material layer (ISM1 in FIG. 11) is etched.

For example, the first etching process EP1 may be an anisotropic etching process. In some exemplary embodiments, the first etching process EP1 may be an anisotropic dry etching process. In some other exemplary embodiments, the first etching process EP1 may be an anisotropic wet etching process. Here, the term "anisotropic etching process" refers to an etching process having linearity. For example, the first inner spacer material layer (ISM1 in FIG. 11) formed on a horizontal surface may be etched more than the first inner spacer material layer ISM1 formed on a vertical surface by the anisotropic etching process.

For example, a portion of the first inner spacer material layer (ISM1 in FIG. 11) etched on the sidewall of the first plurality of nanosheets NW1 by the first etching process EP1 may be defined as a first etched portion. In addition, a portion of the first inner spacer material layer (ISM1 in FIG. 11) etched on the upper surface of the active pattern 101 by the first etching process EP1 may be defined as a second etched portion. A first etched thickness Et1 of the first etched portion in the first horizontal direction DR1 may be thinner than a second etched thickness Et2 of the second etched portion in the vertical direction DR3.

For example, after the first etching process EP1 is performed, at least a portion of the second inner spacer material layer ISM2 may remain on each of the sidewall of the first gate spacer 111, the sidewall of the second gate spacer 121, the upper surface of the first dummy capping pattern DC1, and the upper surface of the second dummy capping pattern DC2. In some other exemplary embodiments, after the first etching process EP1 is performed, each of the upper surface of the first dummy capping pattern DC1 and the upper surface of the second dummy capping pattern DC2 may be exposed.

For example, after the first etching process EP1 is performed, at least a portion of the second inner spacer material layer ISM2 may remain on each of the upper surface of the active pattern 101, the sidewall of the first plurality of nanosheets NW1, the sidewall of the second plurality of nanosheets NW2, and the sidewall of the sacrificial layer 11. That is, the second inner spacer material layer ISM2 may be in contact with each of the upper surface of the active pattern 101, the sidewall of the first plurality of nanosheets NW1, the sidewall of the second plurality of nanosheets NW2, and the sidewall of the sacrificial layer 11.

For example, after the first etching process EP1 is performed, a thickness t3 of the second inner spacer material layer ISM2 remaining on the sidewall of the first plurality of nanosheets NW1 in the first horizontal direction DR1 may be greater than a thickness t4 of the second inner spacer material layer ISM2 remaining on the upper surface of the active pattern 101 in the vertical direction DR3. In addition, after the first etching process EP1 is performed, the thickness t3 of the second inner spacer material layer ISM2 remaining on the sidewall of the first plurality of nanosheets NW1 in the first horizontal direction DR1 may be greater than a thickness of the second inner spacer material layer ISM2 remaining on the upper surface of the first dummy capping pattern DC1 in the vertical direction DR3.

Figure 17:
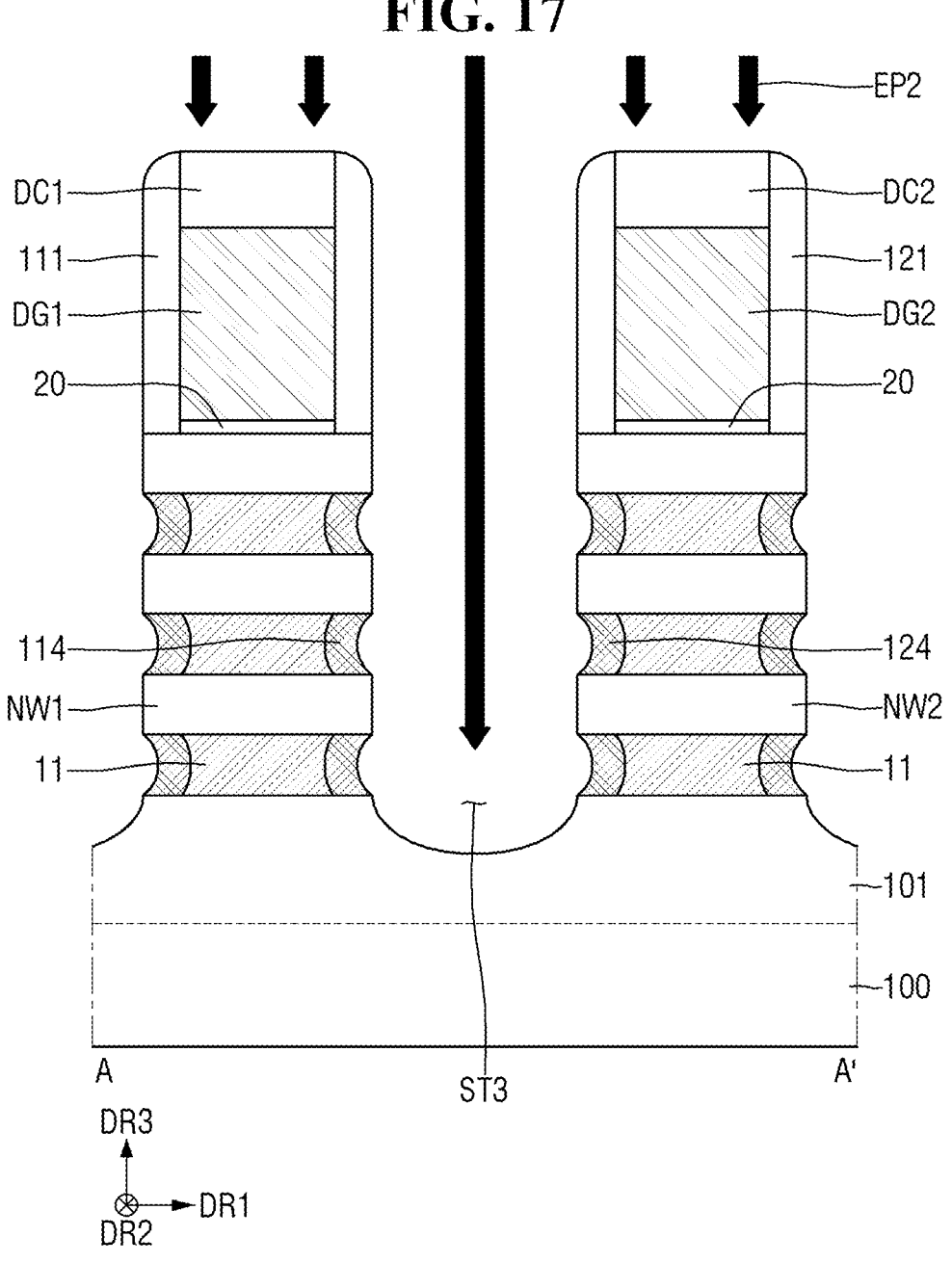

Referring to FIG. 17, a portion of the second inner spacer material layer (ISM2 in FIG. 14) exposed by performing the second etching process EP2 may be etched. Accordingly, a third source/drain trench ST3 may be formed between the first plurality of nanosheets NW1 and the second plurality of nanosheets NW2 on the active pattern 101.

A portion of the second inner spacer material layer (ISM2 in FIG. 14) exposed by performing the second etching process EP2 may be etched to form a first inner spacer 114 and a second inner spacer 124, respectively. Each of the first inner spacer 114 and the second inner spacer 124 may be defined as the second inner spacer material layer (ISM2 in FIG. 14) remaining after a portion of the second inner spacer material layer (ISM2 in FIG. 14) is etched.

For example, the second etching process EP2 may be an isotropic etching process. In some exemplary embodiments, the second etching process EP2 may be an isotropic wet etching process. In some other exemplary embodiments, the second etching process EP2 may be an isotropic dry etching process. Here, the term "isotropic etching process" may refer to an etching process that does not have linearity.

For example, after the second etching process EP2 is performed, the upper surface of the active pattern 101 may be exposed between the first plurality of nanosheets NW1 and the second nanosheets NW2. For example, after the second etching process EP2 is performed, each of the sidewall of the first plurality of nanosheets NW1 and the sidewall of the second nanosheets NW2 may be exposed. For example, after the second etching process EP2 is performed, each of the sidewall of the first gate spacer 111, the sidewall of the second gate spacer 121, the upper surface of the first dummy capping pattern DC1, and the upper surface of the second dummy capping pattern DC2 may be exposed.

After the second etching process EP2 is performed, the second inner spacer material layer (ISM2 in FIG. 14) remaining on the sidewall of the sacrificial layer 11 between the first plurality of nanosheets NW1 may be defined as the first inner spacer 114. In addition, after the second etching process EP2 is performed, the second inner spacer material layer (ISM2 in FIG. 14) remaining on the sidewall of the sacrificial layer 11 between the second plurality of nanosheets NW2 may be defined as the second inner spacer 124.

Figure 18:
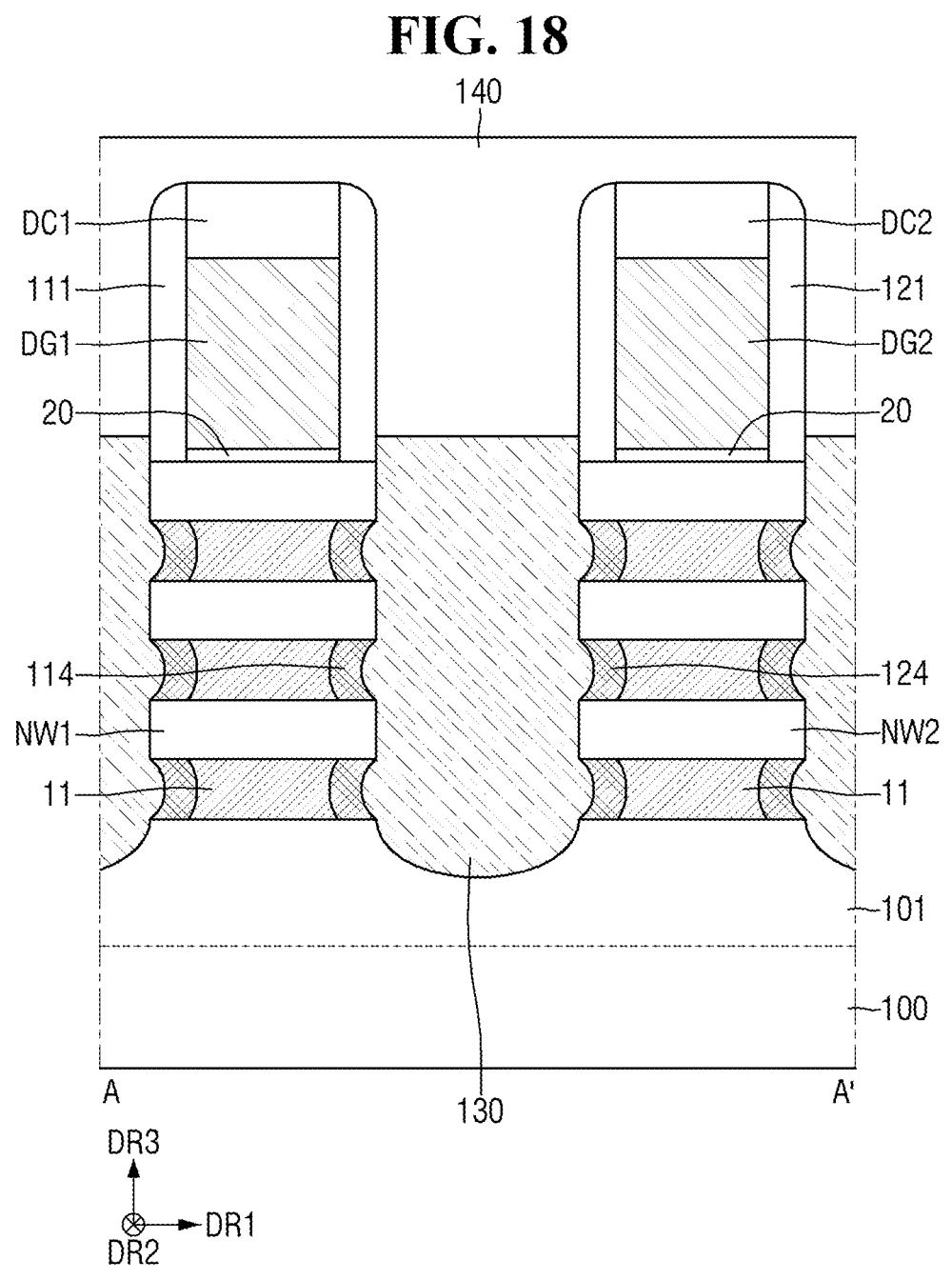

Referring to FIG. 18, a source/drain region 130 may be formed inside the third source/drain trench ST3. The source/drain region 130 may be in contact with each of the sidewall of the first plurality of nanosheets NW1 and the sidewall of the second plurality of nanosheets NW2. In addition, the source/drain region 130 may be in contact with the upper surface of the active pattern 101 between the first plurality of nanosheets NW1 and the second plurality of nanosheets NW2. For example, an upper surface of the source/drain region 130 may be formed to be higher than each of an upper surface of the uppermost nanosheet of the first plurality of nanosheets NW1 and an upper surface of the uppermost nanosheet of the plurality of second nanosheets NW2.

Subsequently, a first interlayer insulating layer 140 may be formed on the upper surface of the substrate 100 to cover the source/drain region 130. The first interlayer insulating layer 140 may surround each of the sidewall of the first gate spacer 111 and the sidewall of the second gate spacer 121. For example, the first interlayer insulating layer 140 may cover each of the upper surfaces of the first capping pattern 113 and the upper surface of the second capping pattern 123.

Figure 19:
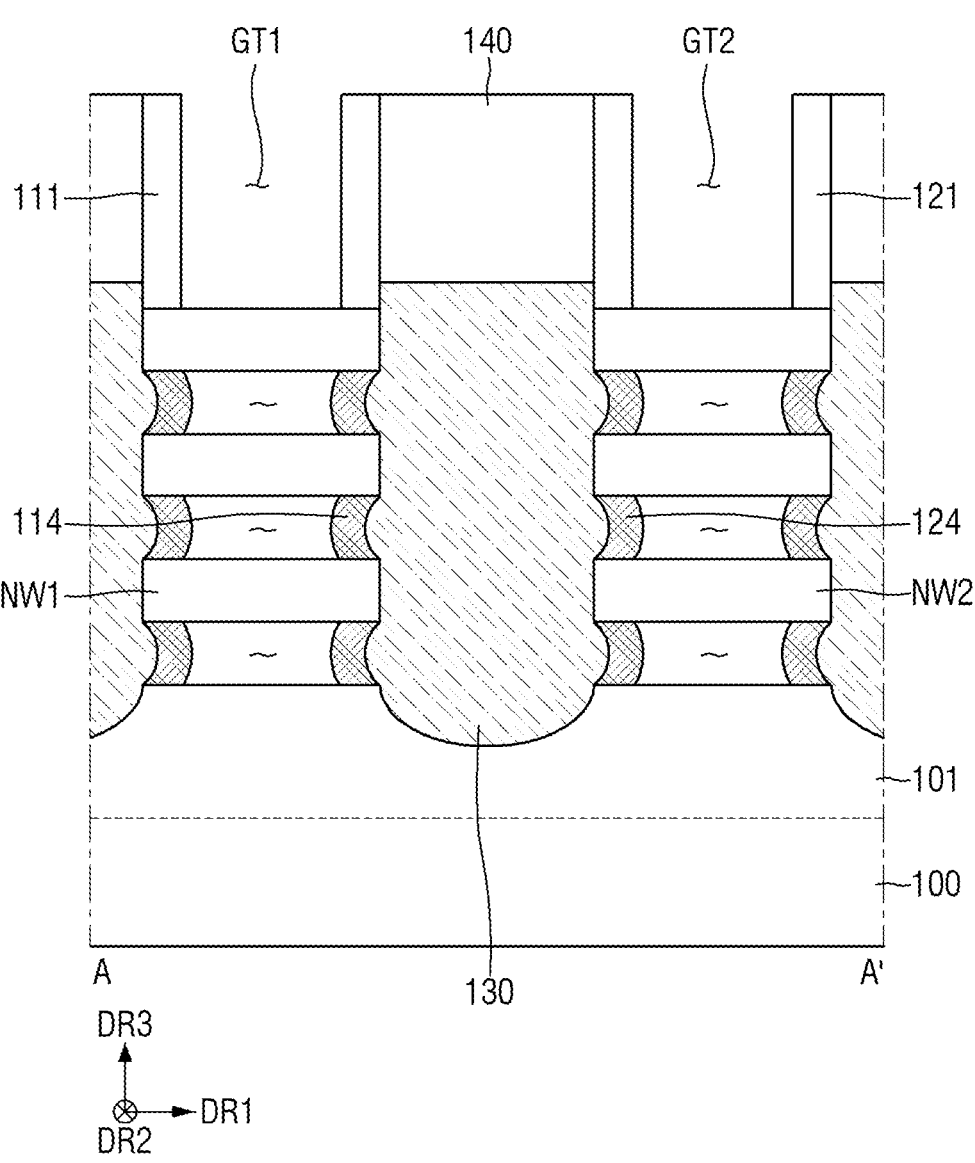
Figure 20:
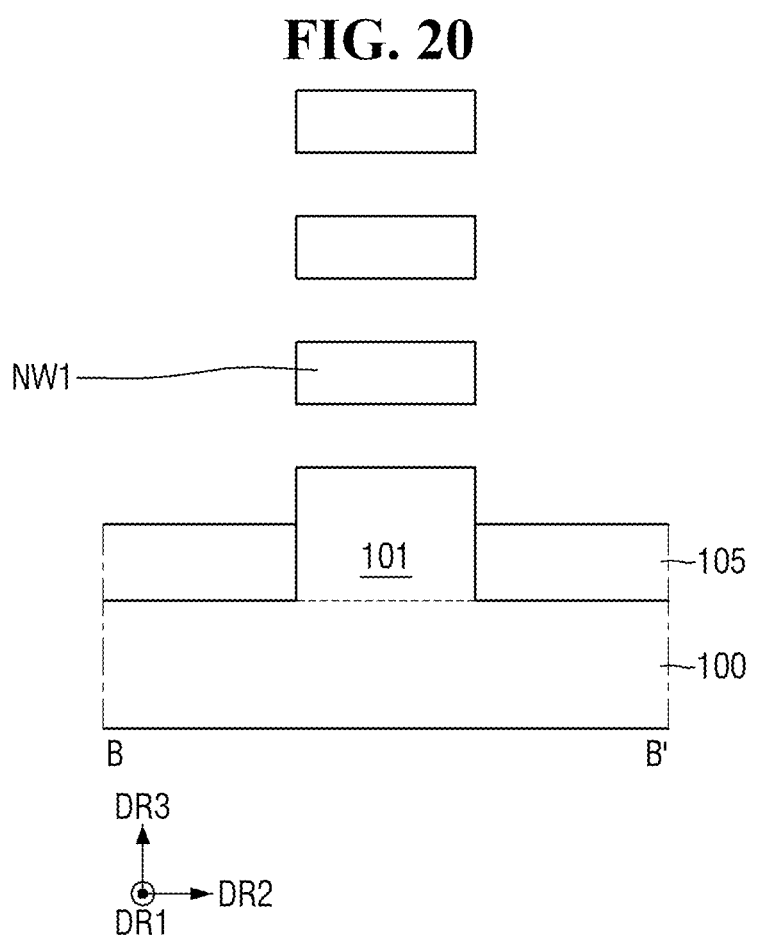

Referring to FIGS. 19 and 20, each of the upper surface of the first dummy gate (DG1 in FIG. 18) and the upper surface of the second dummy gate (DG2 in FIG. 18) may be exposed through a planarization process. Subsequently, each of the first dummy gate (DG1 in FIG. 18), the second dummy gate (DG2 in FIG. 18), the pad oxide layer (20 in FIG. 18), and the sacrificial layer (11 in FIG. 18) may be removed. A portion from which the first dummy gate (DG1 in FIG. 18) is removed may be defined as a first gate trench GT1. In addition, a portion from which the second dummy gate (DG2 in FIG. 18) is removed may be defined as a second gate trench GT2.

Figure 21:
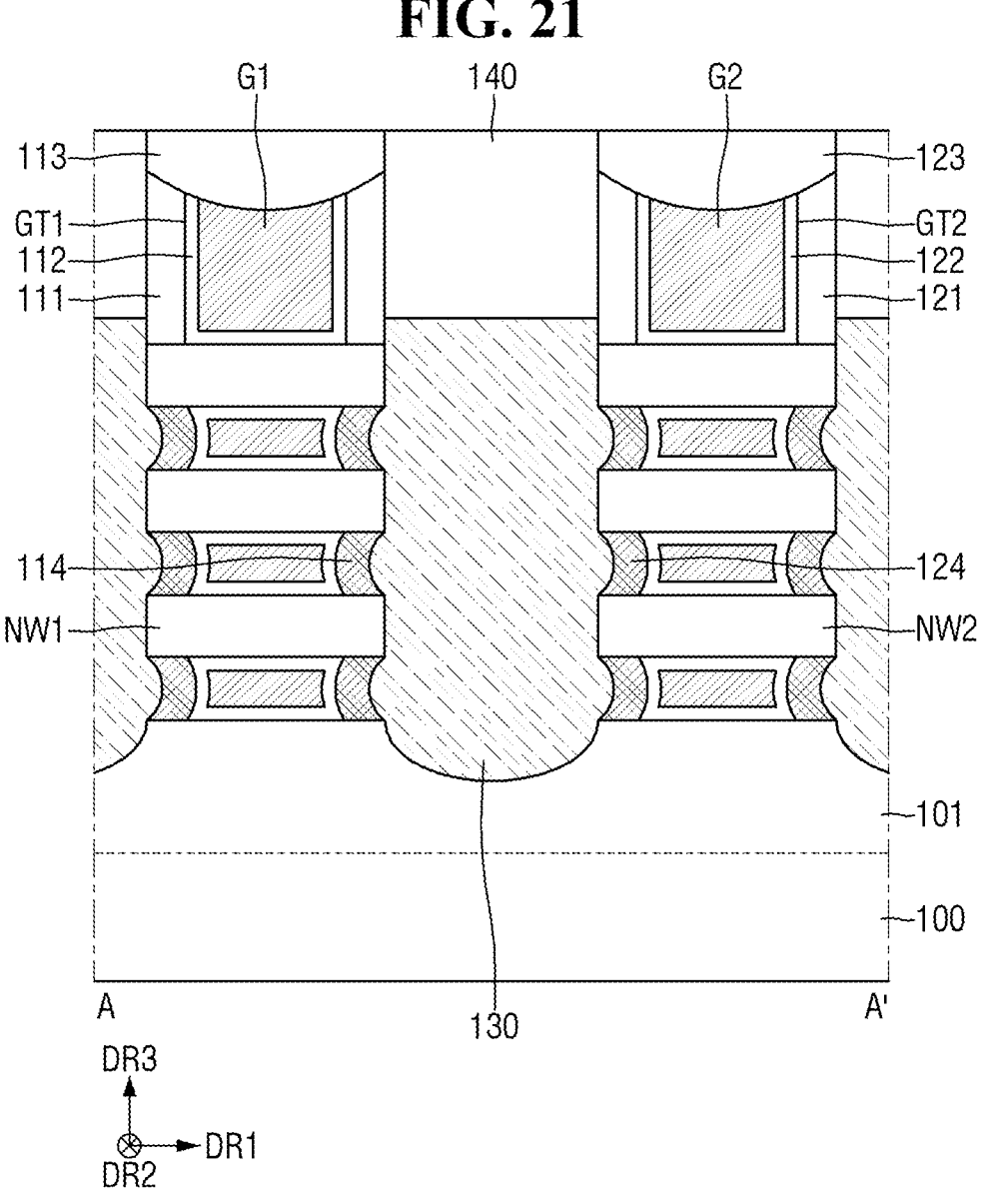
Figure 22:
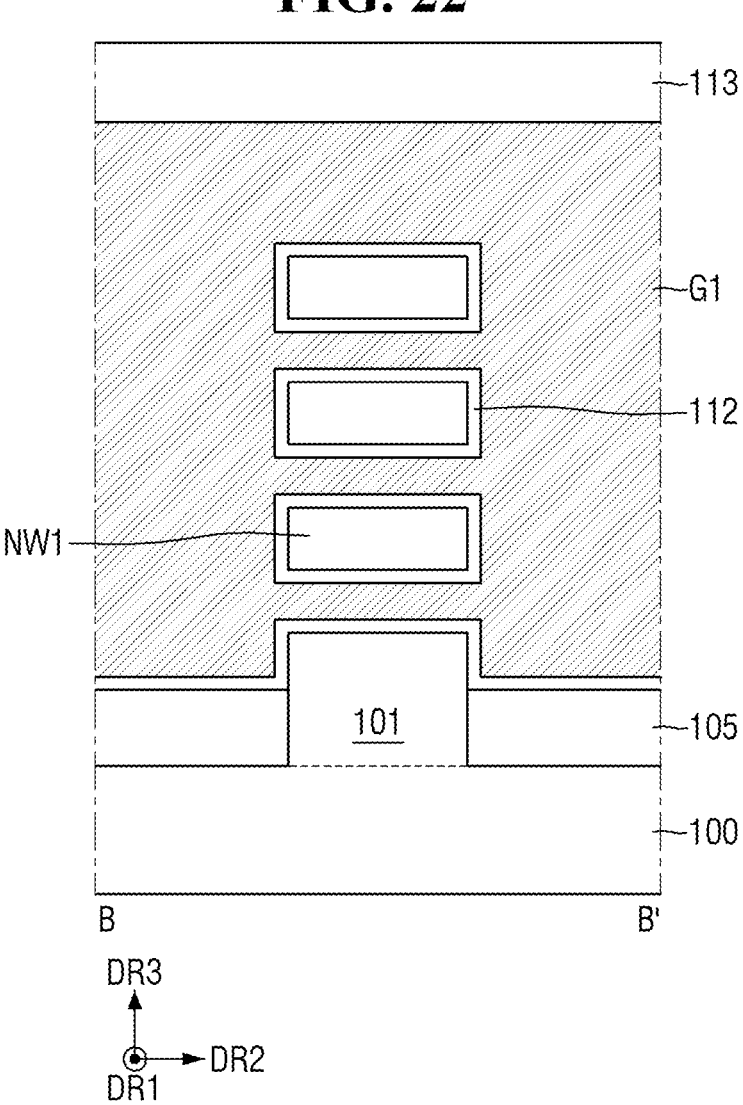

Referring to FIGS. 21 and 22, a first gate insulating layer 112 and a first gate electrode G1 may be sequentially formed inside the first gate trench GT1 and between the first inner spacers 114. In addition, a second gate insulating layer 122 and a second gate electrode G2 may be sequentially formed inside the second gate trench GT2 and between the second inner spacers 124.

Subsequently, the first capping pattern 113 may be formed on an upper surface of each of the first gate insulating layer 112, the first gate electrode G1, and the first gate spacer 111. In addition, the second capping pattern 123 may be formed on an upper surface of each of the second gate insulating layer 122, the second gate electrode G2, and the second gate spacer 121.

Referring to FIGS. 2 and 3, a source/drain contact CA penetrating through the first interlayer insulating layer 140 in the vertical direction DR3 and connected to the source/drain region 130 may be formed. Although not illustrated, a silicide layer may be formed between the source/drain region 130 and the source/drain contact CA. In addition, a gate contact CB penetrating through the first capping pattern 113 in the vertical direction DR3 and connected to the first gate electrode G1 may be formed.

An etching stop layer 145 and a second interlayer insulating layer 150 may be sequentially formed on the upper surface of each of the first interlayer insulating layer 140, the first capping pattern 113, the second capping pattern 123, the source/drain contact CA, and the gate contact CB. Subsequently, a first via V1 penetrating through the etching stop layer 145 and the second interlayer insulating layer 150 in the vertical direction DR3 and connected to the source/drain contact CA may be formed. In addition, a second via V2 penetrating through the etching stop layer 145 and the second interlayer insulating layer 150 in the vertical direction DR3 and connected to the gate contact CB may be formed.

Subsequently, a third interlayer insulating layer 160 may be formed on an upper surface of each of the second interlayer insulating layer 150, the first via V1, and the second via V2. Subsequently, a first wiring pattern 171 connected to the first via V1 may be formed inside the third interlayer insulating layer 160. In addition, a second wiring pattern 172 connected to the second via V2 may be formed inside the third interlayer insulating layer 160. Through such a fabricating process, the semiconductor device illustrated in FIGS. 2 and 3 may be fabricated.

In the method for fabricating the semiconductor device according to some exemplary embodiments, the inner spacers 114 and 124 may be formed by etching a portion of the first inner spacer material layer ISM1 by performing the first etching process EP1, which is the anisotropic etching process, and then additionally etching a portion of the second inner spacer material layer ISM2 by performing the second etching process EP2, which is the isotropic etching process. While the first etching process EP1, which is the anisotropic etching process, is performed, the first inner spacer material layer ISM1 formed on the upper surface of the active pattern 101 may be more etched than the first inner spacer material layer ISM1 formed on the sidewalls of the first and second plurality of nanosheets NW1 and NW2.

That is, after the first etching process EP1, which is the anisotropic etching process, is performed, a thickness of the second spacer material layer ISM2 formed on the upper surface of the active pattern 101 in the vertical direction DR3 may be less than a thickness of the second spacer material layer ISM2 formed on the sidewalls of the first and second plurality of nanosheets NW1 and NW2 in the first horizontal direction DR1. In the method for fabricating the semiconductor device according to some exemplary embodiments of the present disclosure, while the second etching process EP2, which is the isotropic etching process, is being performed, it is possible to etch the second spacer material layer ISM2 formed on the upper surface of the active pattern 101, and to thereby prevent the second spacer material layer ISM2 formed on the sidewall of the sacrificial layer 11 from being excessively etched. Accordingly, the inner spacers 114 and 124 may be stably formed on the sidewall of the sacrificial layer 11.

Hereinafter, a method for fabricating a semiconductor device according to some other exemplary embodiments of the present disclosure will be described with reference to FIGS. 23 to 25. Differences from the method for fabricating the semiconductor device illustrated in FIGS. 2 to 22 and that illustrated in FIGS. 23 to 25 will be mainly described.

Figure 23:
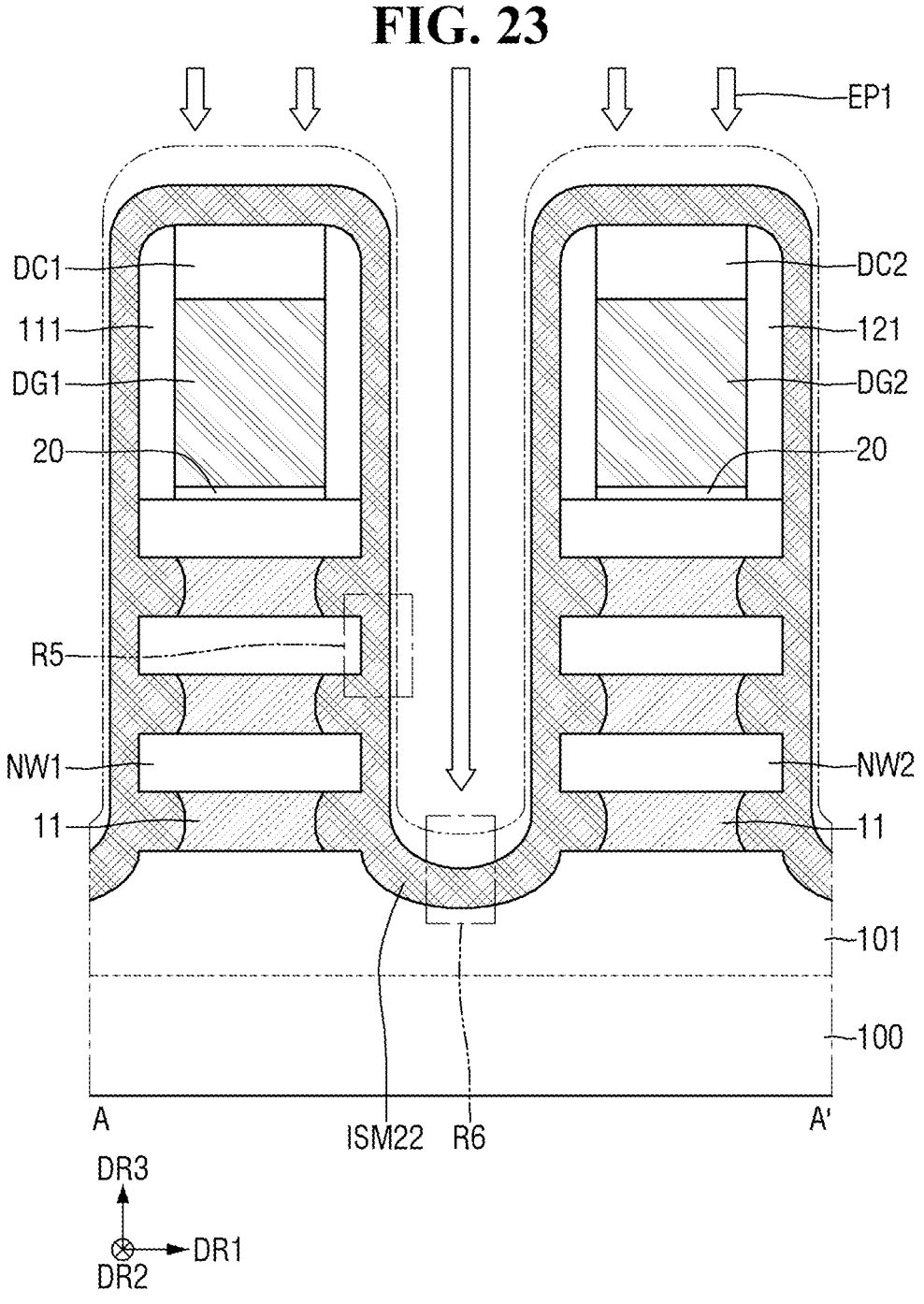
FIG. 23 is an intermediate step view for describing a method for fabricating a semiconductor device according to some other exemplary embodiments.

FIG. 23 is an intermediate step view depicting a method for fabricating a semiconductor device according to the other exemplary embodiments. FIG. 24 is an enlarged view of region R5 of FIG. 23. FIG. 25 is an enlarged view of region R6 of FIG. 23.

Referring to FIGS. 23 to 25, after the fabricating process illustrated in FIGS. 4 to 13 is performed, a portion of the first inner spacer material layer (ISM1 in FIG. 11) exposed by performing the first etching process EP1 may be etched to form a second inner spacer material layer ISM22. The second inner spacer material layer ISM22 may be defined as a first inner spacer material layer (ISM1 in FIG. 11) that remains after a portion of the first inner spacer material layer (ISM1 in FIG. 11) is etched.

The first etching process EP1 may be an anisotropic etching process. In some exemplary embodiments, the first etching process EP1 may be an anisotropic dry etching process. In some other exemplary embodiments, the first etching process EP1 may be an anisotropic wet etching process.

For example, a portion of the first inner spacer material layer (ISM1 in FIG. 11) etched on the sidewall of the first plurality of nanosheets NW1 by the first etching process EP1 may be defined as a first etched portion. In addition, a portion of the first inner spacer material layer (ISM1 in FIG.

11) etched on the upper surface of the active pattern 101 by the first etching process EP1 may be defined as a second etched portion. For example, a first etched thickness Et21 of the first etched portion in the first horizontal direction DR1 may be less than a second etched thickness Et22 of the second etched portion in the vertical direction DR3.

For example, after the first etching process EP1 is performed, a thickness t23 of the second inner spacer material layer ISM22 remaining on the sidewall of the first plurality of nanosheets NW1 in the first horizontal direction DR1 may be less than a thickness t24 of the second inner spacer material layer ISM22 remaining on the upper surface of the active pattern 101 in the vertical direction DR3. In addition, after the first etching process EP1 is performed, the thickness t23 of the second inner spacer material layer ISM22 remaining on the sidewall of the first plurality of nanosheets NW1 in the first horizontal direction DR1 may be less than a thickness of the second inner spacer material layer ISM22 remaining on the upper surface of the first dummy capping pattern DC1 in the vertical direction DR3.

Subsequently, after the fabricating process illustrated in FIGS. 17 to 22 is performed, the source/drain contact CA, the gate contact CB, the etching stop layer 145, the second interlayer insulating layer 150, the first via V1, the second via V2, the third interlayer insulating layer 160, the first wiring pattern 171, and the second wiring pattern 172 may be formed to fabricate the semiconductor device illustrated in FIGS. 2 and 3.

Hereinafter, a semiconductor device fabricated by a method for fabricating a semiconductor device according to some exemplary embodiments will be described with reference to FIG. 26. Differences from the semiconductor device illustrated in FIGS. 2 and 3 will be mainly described.

Figure 26:
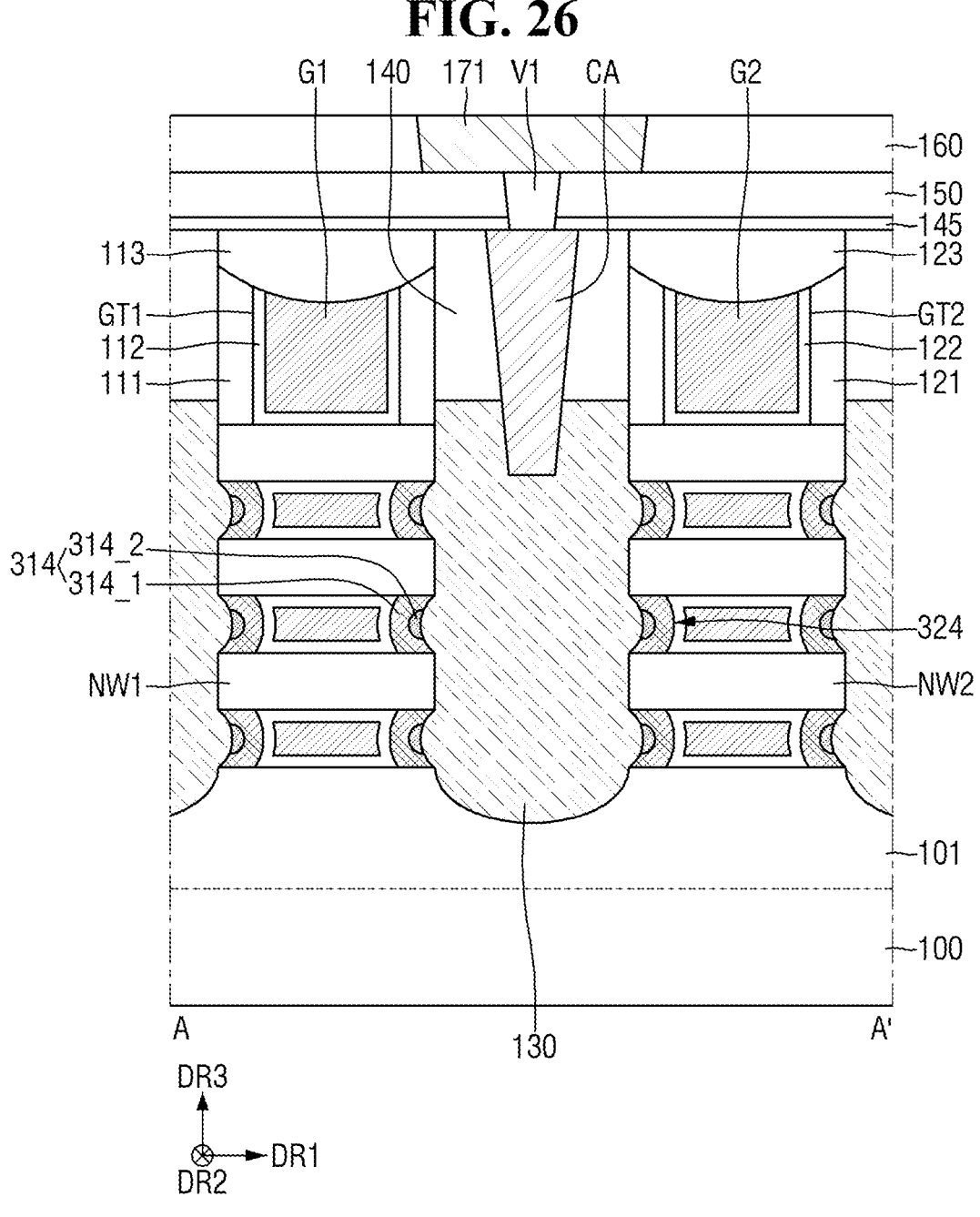
FIG. 26 is a cross-sectional view for describing a semiconductor device fabricated by a method for fabricating a semiconductor device according to still other exemplary embodiments.

FIG. 26 is a cross-sectional view for describing a semiconductor device fabricated by a method for fabricating a semiconductor device according to some other exemplary embodiments.

Referring to FIG. 26, a semiconductor device fabricated by a method for fabricating a semiconductor device according to some other embodiments may have a first inner spacer 314 and a second inner spacer 324 each formed as a double film.

For example, the first inner spacer 314 may include a first layer 314_1 and a second layer 314_2 disposed on the first layer 314_1. The first layer 314_1 may be in contact with each of the first gate insulating layer 112, the active pattern 101, the first plurality of nanosheets NW1, and the source/drain region 130. The second layer 314_2 may be in contact with each of the first layer 314_1 and the source/drain region 130. The second layer 314_2 may be surrounded by the first layer 314_1 and the source/drain region 130. The second layer 314_2 may be spaced apart from each of the active pattern 101 and the first plurality of nanosheets NW1.

For example, the first layer 314_1 and the second layer 314_2 may include different materials. For example, the first layer 314_1 may include any one of silicon nitride (SiN), silicon oxynitride (SiON), silicon carbonitride (SiCN), silicon oxycarbonitride (SiOCN), silicon boron nitride (SiBN), silicon oxyboronitride (SiOBN), and silicon boron carbon nitride (SiBCN). The second layer 314_2 may include the other of silicon nitride (SiN), silicon oxynitride (SiON), silicon carbonitride (SiCN), silicon oxycarbonitride (SiOCN), silicon boron nitride (SiBN), silicon oxyboronitride (SiOBN), and silicon boron carbon nitride (SiBCN).

The second inner spacer 324 may include a first layer 314_1 and a second layer 314_2 disposed on the first layer 314_1. The second inner spacer 324 may have the same structure as the first inner spacer 314. Therefore, a detailed description of the second inner spacer 324 will not be repeated.

Hereinafter, a method for fabricating a semiconductor device according to some other exemplary embodiments of the present disclosure will be described with reference to FIGS. 26 to 33. Differences from the method for fabricating the semiconductor device illustrated in FIGS. 2 to 22 will be mainly described.

Figure 27:
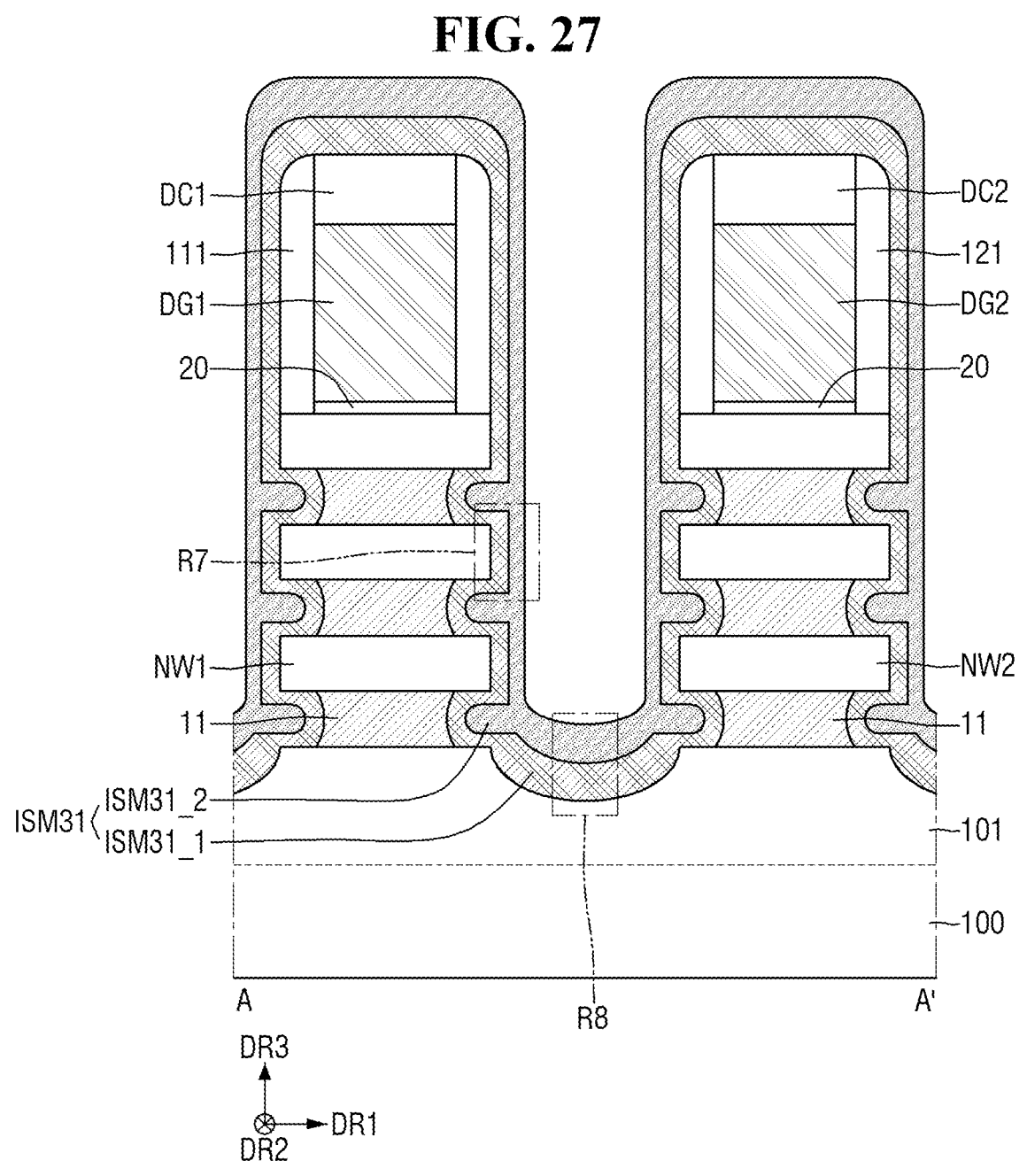
Figure 28:
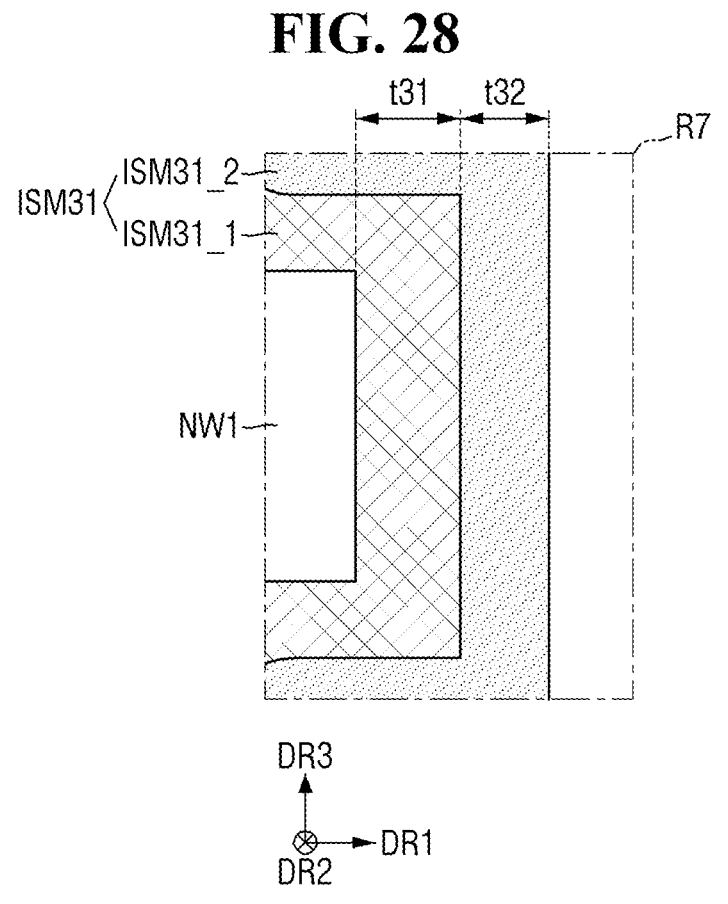
Figure 29:
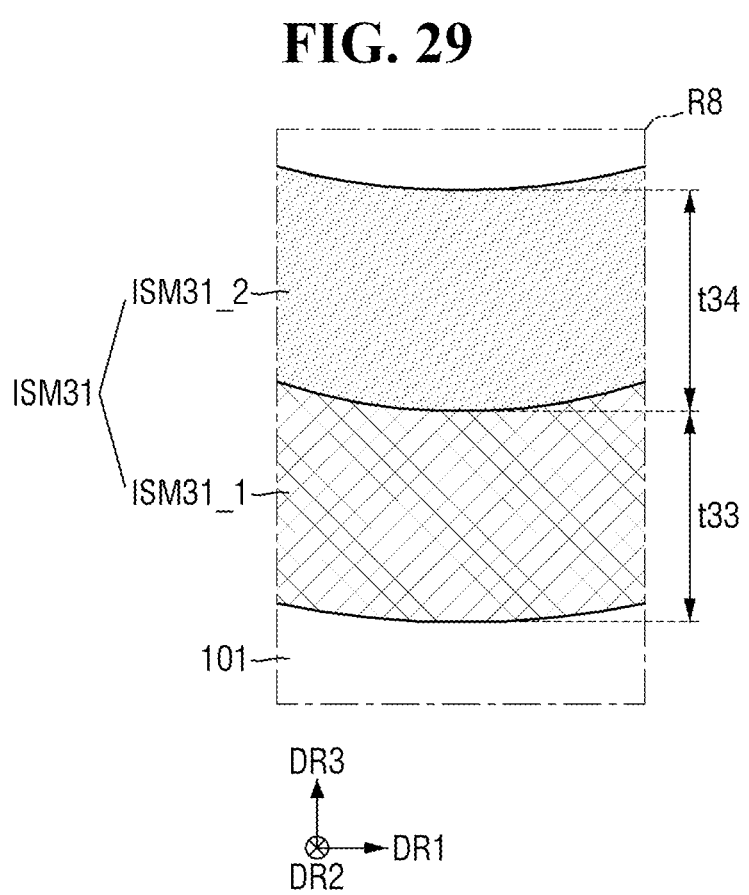
Figure 31:
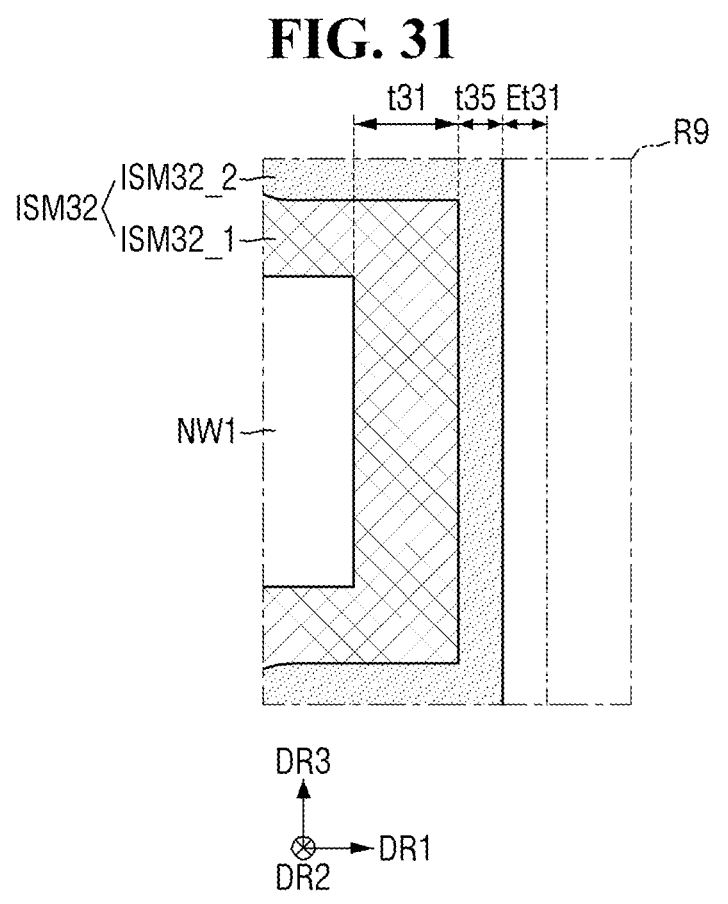
Figure 32:
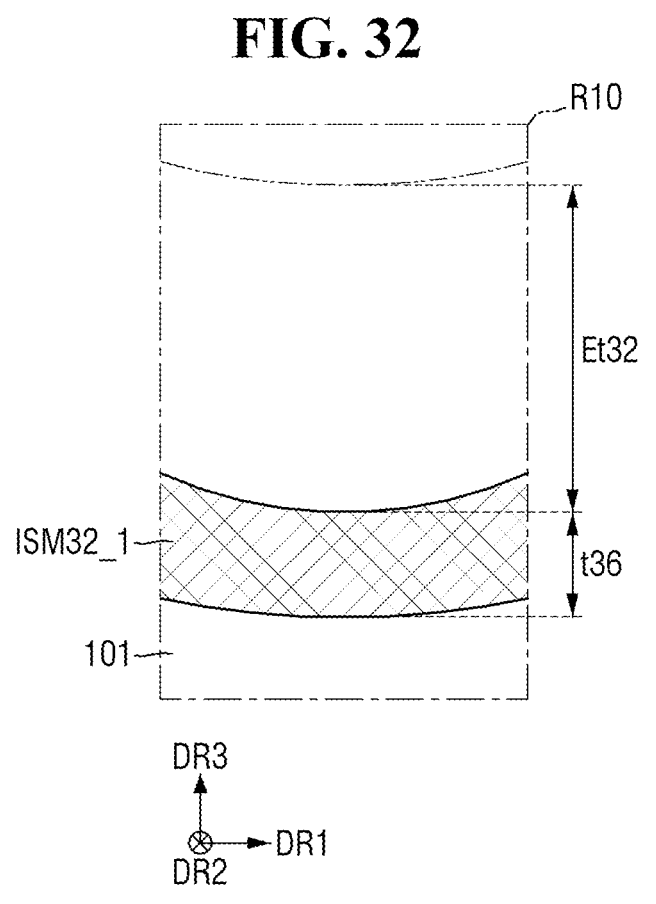

FIGS. 27 to 33 are intermediate step views for describing a method for fabricating a semiconductor device according to some other exemplary embodiments. FIG. 28 is an enlarged view of region R7 of FIG. 27. FIG. 29 is an enlarged view of region R8 of FIG. 27. FIG. 31 is an enlarged view of region R9 of FIG. 30. FIG. 32 is an enlarged view of region R10 of FIG. 30.

Referring to FIGS. 27 to 29, after the fabricating process illustrated in FIGS. 4 to 10 is performed, a first inner spacer material layer ISM31 may be formed along the sidewall and the bottom surface of the second source/drain trench (ST2 in FIG. 10). In addition, the first inner spacer material layer ISM31 may also be formed on each of the sidewall of the first gate spacer 111, the sidewall of the second gate spacer 121, the upper surface of the first dummy capping pattern DC1, and the upper surface of the second dummy capping pattern DC2. For example, the first inner spacer material layer ISM31 may include a first material layer ISM31_1 and a second material layer ISM31_2 disposed on the first material layer ISM31_1.

For example, the first material layer ISM31_1 of the first inner spacer material layer ISM31 may be in contact with each other of the upper surface of the active pattern 101, the sidewall of the first plurality of nanosheets NW1, the sidewall of the second plurality of nanosheets NW2, the sidewall of the sacrificial layer 11, the sidewall of the first gate spacer 111, the sidewall of the first gate spacer 111, the sidewall of the second gate spacer 121, the upper surface of the first dummy capping pattern DC1, and the upper surface of the second dummy capping pattern DC2 that are exposed to the second source/drain trench (ST2 in FIG. 10).

For example, the second material layer ISM31_2 of the first inner spacer material layer ISM31 may be formed on the first material layer ISM31_1 of the first inner spacer material layer ISM31. At least a portion of the second material layer ISM31_2 of the first inner spacer material layer ISM31 may be disposed between the active pattern 101 and the lowest nanosheet of the first plurality of nanosheets NW1. At least a portion of the second material layer ISM31_2 of the first inner spacer material layer ISM31 may be disposed between the first plurality of nanosheets NW1. In addition, at least a portion of the second material layer ISM31_2 of the first inner spacer material layer ISM31 may be disposed between the active pattern 101 and the lowest nanosheet of the second plurality of nanosheets NW2. At least a portion of the second material layer ISM31_2 of the first inner spacer material layer ISM31 may be disposed between the second plurality of nanosheets NW2.

For example, a thickness t31 of the first material layer ISM31_1 of the first inner spacer material layer ISM31 formed on the sidewall of the first plurality of nanosheets NW1 in the first horizontal direction DR1 may be less than a thickness t33 of the first material layer ISM31_1 of the first inner spacer material layer ISM31 formed on the active pattern 101 inside the second source/drain trench (ST2 in FIG. 10) in the vertical direction DR3. For example, the thickness t31 of the first material layer ISM31_1 of the first inner spacer material layer ISM31 formed on the sidewall of the first plurality of nanosheets NW1 in the first horizontal direction DR1 may be smaller than a thickness of the first material layer ISM31_1 of the first inner spacer material layer ISM31 formed on the upper surface of the first dummy capping pattern DC1 in the vertical direction DR3.

For example, a thickness t32 of the second material layer ISM31_2 of the first inner spacer material layer ISM31 formed on the sidewall of the first plurality of nanosheets NW1 in the first horizontal direction DR1 may be less than a thickness t34 of the second material layer ISM31_2 of the first inner spacer material layer ISM31 formed on the active pattern 101 inside the second source/drain trench (ST2 in FIG. 10) in the vertical direction DR3. For example, the thickness t32 of the second material layer ISM31_2 of the first inner spacer material layer ISM31 formed on the sidewall of the first plurality of nanosheets NW1 in the first horizontal direction DR1 may be less than a thickness of the second material layer ISM31_2 of the first inner spacer material layer ISM31 formed on the upper surface of the first dummy capping pattern DC1 in the vertical direction DR3.

For example, the first material layer ISM31_1 of the first inner spacer material layer ISM31 and the second material layer ISM31_2 of the first inner spacer material layer ISM31 may include different materials. For example, the first material layer ISM31_1 of the first inner spacer material layer ISM31 may include any one of silicon nitride (SiN), silicon oxynitride (SiON), silicon carbonitride (SiCN), silicon oxycarbonitride (SiOCN), silicon boron nitride (SiBN), silicon oxyboronitride (SiOBN), and silicon boron carbon nitride (SiBCN), and the second material layer ISM31_2 of the first inner spacer material layer ISM31 may include the other of silicon nitride (SiN), silicon oxynitride (SiON), silicon carbonitride (SiCN), silicon oxycarbonitride (SiOCN), silicon boron nitride (SiBN), silicon oxyboronitride (SiOBN), and silicon boron carbon nitride (SiBCN).

Figure 30:
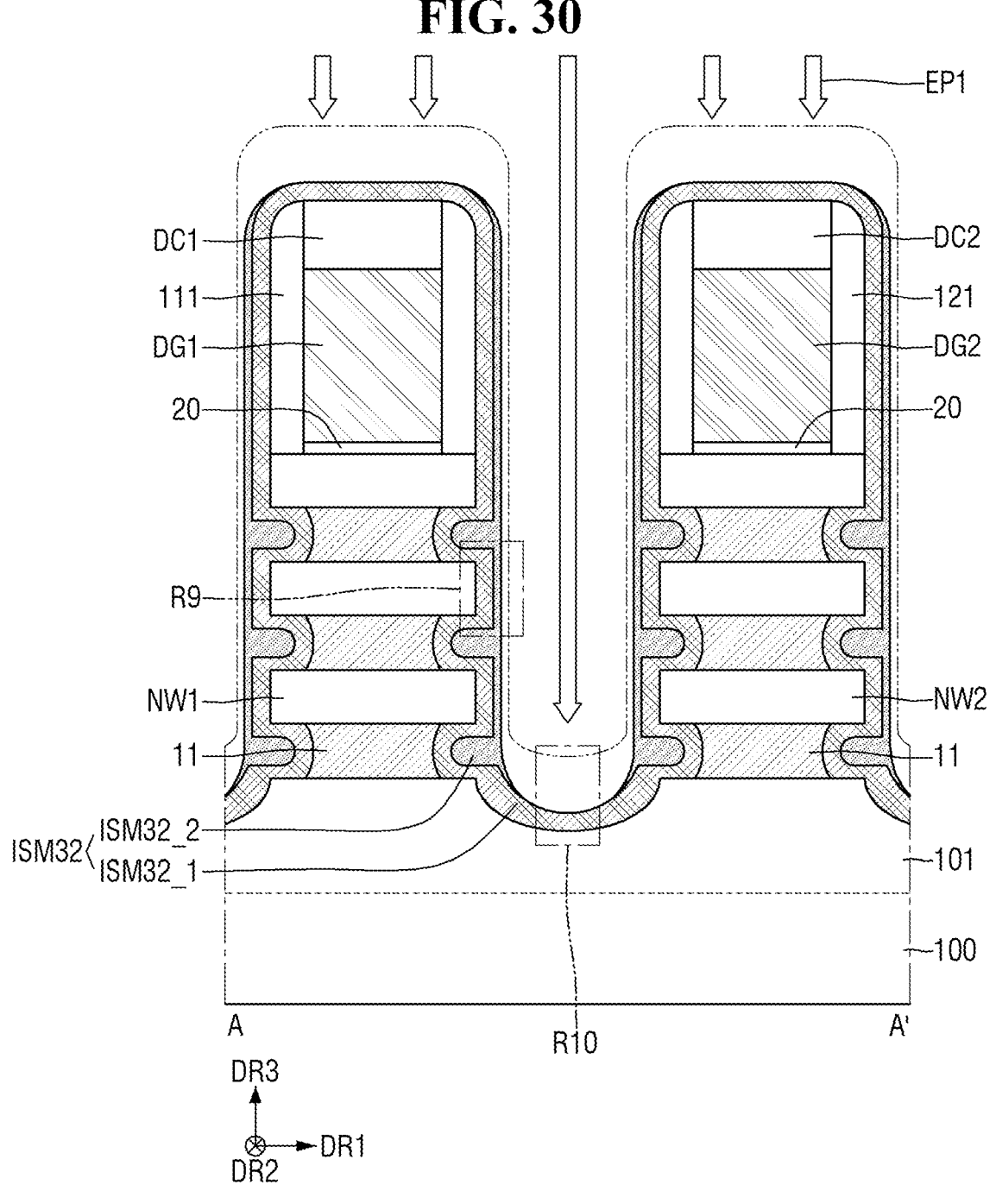

Referring to FIGS. 30 to 32, a portion of the first inner spacer material layer (ISM31 in FIG. 27) exposed by performing the first etching process EP1 may be etched to form a second inner spacer material layer ISM32. The second inner spacer material layer ISM32 may be defined as a first inner spacer material layer (ISM31 in FIG. 27) remaining after a portion of the first inner spacer material layer (ISM31 in FIG. 27) is etched.

For example, the second inner spacer material layer ISM32 may include a first material layer ISM32_1 and a second material layer ISM32_2 disposed on the first material layer ISM32_1. The first material layer ISM32_1 of the second inner spacer material layer ISM32 may be defined as a first material layer (ISM31_1 in FIG. 27) of the first inner spacer material layer (ISM31 in FIG. 27) remaining after a portion of the first material layer (ISM31_1 in FIG. 27) of the first inner spacer material layer (ISM31 in FIG. 27) is etched. In addition, the second material layer ISM32_2 of the second inner spacer material layer ISM32 may be defined as a second material layer (ISM31_2 in FIG. 27) of the first inner spacer material layer (ISM31 in FIG. 27) remaining after a portion of the second material layer (ISM31_2 in FIG. 27) of the first inner spacer material layer (ISM31 in FIG. 27) is etched.

For example, the first etching process EP1 may be an anisotropic etching process. In some exemplary embodiments, the first etching process EP1 may be an anisotropic dry etching process. In some other exemplary embodiments, the first etching process EP1 may be an anisotropic wet etching process.

For example, a portion of the second material layer (ISM31_2 in FIG. 27) of the first inner spacer material layer (ISM31 in FIG. 27) formed on the sidewall of the first plurality of nanosheets NW1 may be etched by the first etching process EP1. That is, after the first etching process EP1 is performed, the first material layer ISM32_1 of the second inner spacer material layer ISM32 is not exposed on the sidewall of the first plurality of nanosheets NW1.

In addition, a portion of the second material layer (ISM31_2 in FIG. 27) of the first inner spacer material layer (ISM31 in FIG. 27) and the first material layer (ISM31_1 in FIG. 27) of the first inner spacer material layer (ISM31 in FIG. 27) formed on the upper surface of the active pattern 101 may be etched by the first etching process EP1. That is, the first material layer ISM32_1 of the second inner spacer material layer ISM32 may be exposed on the upper surface of the active pattern 101 by the first etching process EP1.

In addition, a portion of the second material layer (ISM31_2 in FIG. 27) of the first inner spacer material layer (ISM31 in FIG. 27) and the first material layer (ISM31_1 in FIG. 27) of the first inner spacer material layer (ISM31 in FIG. 27) formed on the upper surface of the first dummy capping pattern DC1 may be etched by the first etching process EP1. That is, the first material layer ISM32_1 of the second inner spacer material layer ISM32 may be exposed on the upper surface of the active pattern 101 by the first etching process EP1.

For example, a portion of the second material layer (ISM31_2 in FIG. 27) of the first inner spacer material layer (ISM31 in FIG. 27) etched on the sidewall of the first plurality of nanosheets NW1 by the first etching process EP1 may be defined as a first etched portion. In addition, a portion of the second material layer (ISM31_2 in FIG. 27) of the first inner spacer material layer (ISM31 in FIG. 27) and the first material layer (ISM31_1 in FIG. 27) of the first inner spacer material layer (ISM31 in FIG. 27) etched on the upper surface of the active pattern 101 by the first etching process EP1 may be defined as a second etched portion. For example, a first etched thickness Et31 of the first etched portion in the first horizontal direction DR1 may be less than a second etched thickness Et32 of the second etched portion in the vertical direction DR3.

For example, after the first etching process EP1 is performed, a sum of a thickness t31 of the first material layer ISM32_1 of the second inner spacer material layer ISM32 in the first horizontal direction DR1 and a thickness t35 of the second material layer ISM32_2 of the second inner spacer material layer ISM32 in the first horizontal direction DR1 remaining on the sidewall of the first plurality of nanosheets NW1 may be greater than a thickness t36 of the first material layer ISM32_1 of the second inner spacer material layer ISM32 remaining on the upper surface of the active pattern 101 in the vertical direction DR3.

For example, after the first etching process EP1 is performed, the sum of the thickness t31 of the first material layer ISM32_1 of the second inner spacer material layer ISM32 in the first horizontal direction DR1 and the thickness t35 of the second material layer ISM32_2 of the second inner spacer material layer ISM32 in the first horizontal direction DR1 remaining on the sidewall of the first plurality of nanosheets NW1 may be greater than a thickness of the first material layer ISM32_1 of the second inner spacer material layer ISM32 remaining on the upper surface of the first dummy capping pattern DC1 in the vertical direction DR3.

Figure 33:
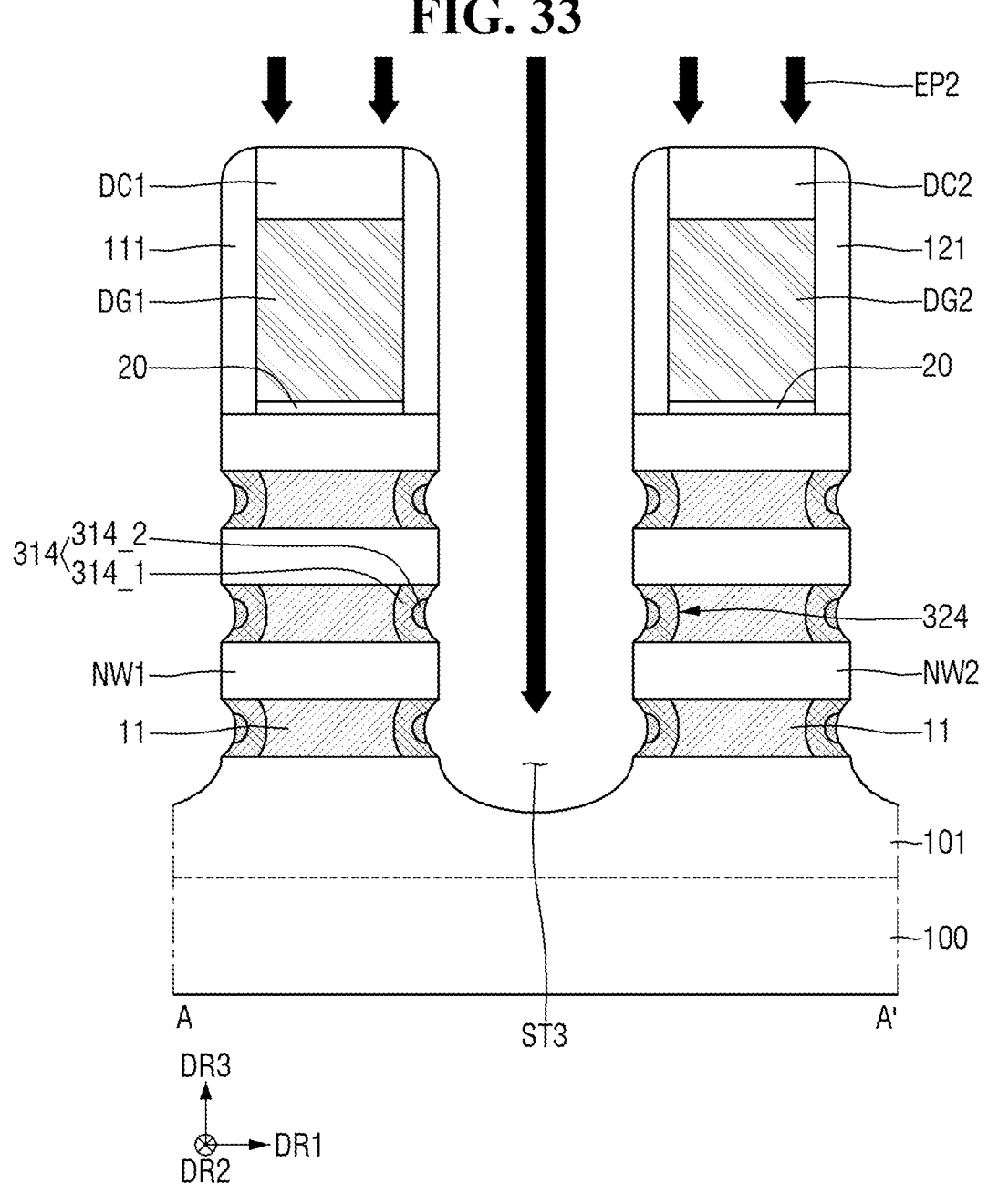

Referring to FIG. 33, a portion of the second inner spacer material layer (ISM32 in FIG. 30) exposed by performing the second etching process EP2 may be etched. Accordingly, a third source/drain trench ST3 may be formed between the first nanosheets NW1 and the second plurality of nanosheets NW2 on the active pattern 101.

For example, a portion of the second inner spacer material layer (ISM32 in FIG. 30) exposed by performing the second etching process EP2 may be etched to form a first inner spacer 314 and a second inner spacer 324, respectively. Each of the first inner spacer 314 and the second inner spacer 324 may be defined as the second inner spacer material layer (ISM32 in FIG. 30) remaining after a portion of the second inner spacer material layer (ISM32 in FIG. 30) is etched.

For example, after the second etching process EP2 is performed, the first material layer (ISM32_1 in FIG. 30) of the remaining second inner spacer material layer (ISM32 in FIG. 30) may be defined as a first layer 314_1. In addition, after the second etching process EP2 is performed, the second material layer (ISM32_2 in FIG. 30) of the remaining second inner spacer material layer (ISM32 in FIG. 30) may be defined as a second layer 314_2.

For example, the second etching process EP2 may be an isotropic etching process. In some exemplary embodiments, the second etching process EP2 may be an isotropic wet etching process. In some other exemplary embodiments, the second etching process EP2 may be an isotropic dry etching process. Here, the isotropic etching process refers to an etching process that does not have linearity.

For example, after the second etching process EP2 is performed, the upper surface of the active pattern 101 may be exposed between the first nanosheets NW1 and the second plurality of nanosheets NW2. For example, after the second etching process EP2 is performed, each of the sidewall of the first plurality of nanosheets NW1 and the sidewall of the second plurality of nanosheets NW2 may be exposed. For example, after the second etching process EP2 is performed, each of the sidewall of the first gate spacer 111, the sidewall of the second gate spacer 121, the upper surface of the first dummy capping pattern DC1, and the upper surface of the second dummy capping pattern DC2 may be exposed.

Subsequently, after the fabricating process illustrated in FIGS. 18 to 22 is performed, the source/drain contact CA, the gate contact CB, the etching stop layer 145, the second interlayer insulating layer 150, the first via V1, the second via V2, the third interlayer insulating layer 160, the first wiring pattern 171, and the second wiring pattern 172 may be formed to fabricate the semiconductor device illustrated in FIG. 26.

Hereinafter, a method for fabricating a semiconductor device according to some other exemplary embodiments will be described with reference to FIGS. 34 to 36. Differences between each the methods for fabricating the semiconductor device illustrated in FIGS. 2 to 22 and the methods for fabricating the semiconductor device illustrated in FIGS. 26 to 33 will be mainly described.

Figure 34:
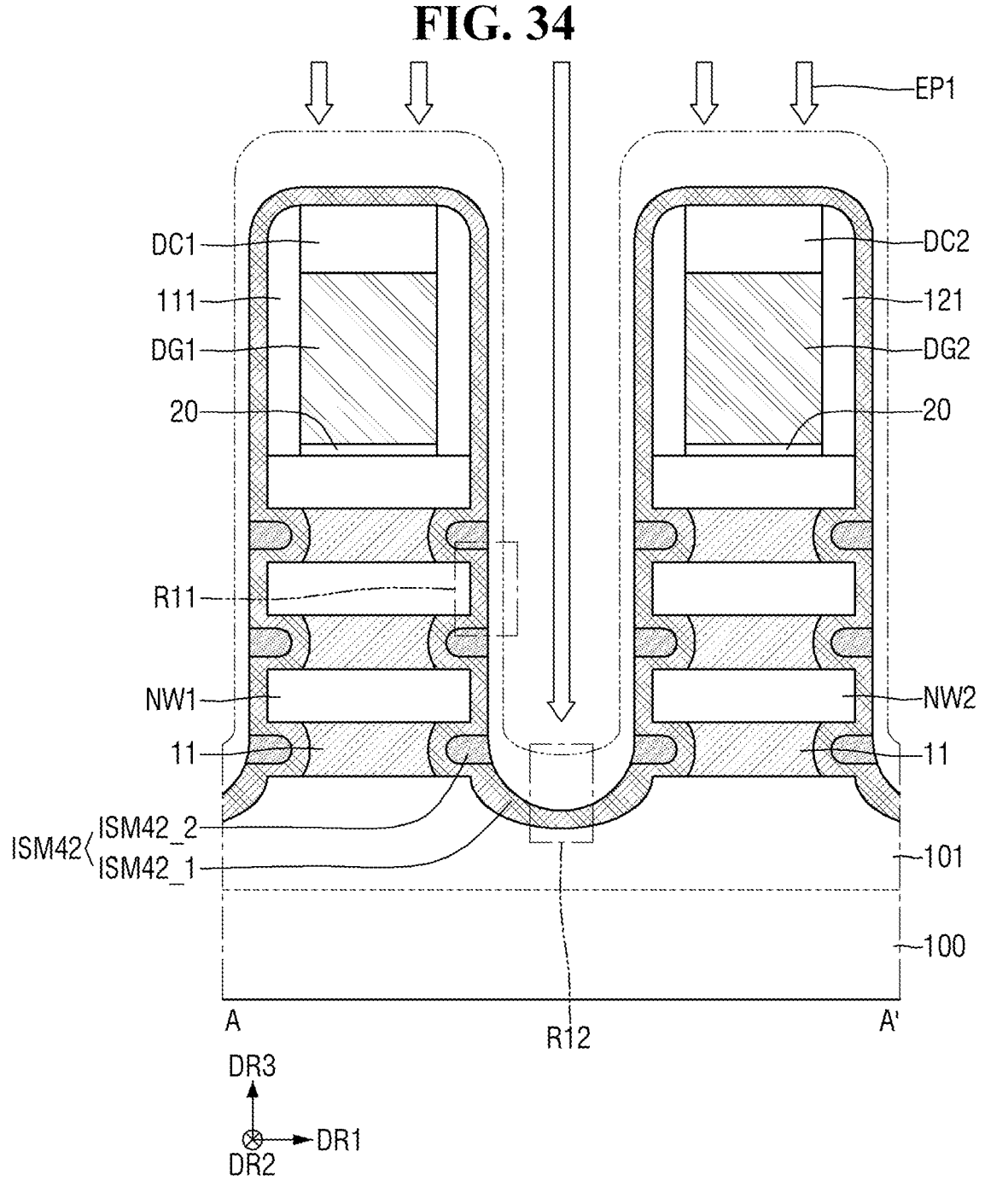
FIG. 34 is an intermediate step view for describing a method for fabricating a semiconductor device according to still other exemplary embodiments of the present disclosure.

FIG. 34 is an intermediate step view for describing a method for fabricating a semiconductor device according to some other exemplary embodiments of the present disclosure. FIG. 35 is an enlarged view of region R11 of FIG. 34. FIG. 36 is an enlarged view of region R12 of FIG. 34.

Referring to FIGS. 34 to 36, after the fabricating process illustrated in FIGS. 4 to 10 is performed, a portion of the first inner spacer material layer (ISM31 in FIG. 27) exposed by performing the first etching process EP1 may be etched to form a second inner spacer material layer ISM42. The second inner spacer material layer ISM42 may be defined as a first inner spacer material layer (ISM31 in FIG. 27) remaining after a portion of the first inner spacer material layer (ISM31 in FIG. 27) is etched.

For example, the second inner spacer material layer ISM42 may include a first material layer ISM42_1 and a second material layer ISM42_2 disposed on the first material layer ISM42_1. The first material layer ISM42_1 of the second inner spacer material layer ISM42 may be defined as a first material layer (ISM31_1 in FIG. 27) of the first inner spacer material layer (ISM31 in FIG. 27) remaining after a portion of the first material layer (ISM31_1 in FIG. 27) of the first inner spacer material layer (ISM31 in FIG. 27) is etched. In addition, the second material layer ISM42_2 of the second inner spacer material layer ISM42 may be defined as a second material layer (ISM31_2 in FIG. 27) of the first inner spacer material layer (ISM31 in FIG. 27) remaining after a portion of the second material layer (ISM31_2 in FIG. 27) of the first inner spacer material layer (ISM31 in FIG. 27) is etched.

For example, the first etching process EP1 may be an anisotropic etching process. In some exemplary embodiments, the first etching process EP1 may be an anisotropic dry etching process. In some other exemplary embodiments, the first etching process EP1 may be an anisotropic wet etching process.

For example, the second material layer (ISM31_2 in FIG. 27) of the first inner spacer material layer (ISM31 in FIG. 27) formed on the sidewall of the first plurality of nanosheets NW1 may be etched by the first etching process EP1. That is, after the first etching process EP1 is performed, the first material layer ISM42_1 of the second inner spacer material layer ISM42 may be exposed on the sidewall of the first plurality of nanosheets NW1.

In addition, a portion of the second material layer (ISM31_2 in FIG. 27) of the first inner spacer material layer (ISM31 in FIG. 27) and the first material layer (ISM31_1 in FIG. 27) of the first inner spacer material layer (ISM31 in FIG. 27) formed on the upper surface of the active pattern 101 may be etched by the first etching process EP1. That is, the first material layer ISM42_1 of the second inner spacer material layer ISM42 may be exposed on the upper surface of the active pattern 101 by the first etching process EP1.

In addition, a portion of the second material layer (ISM31_2 in FIG. 27) of the first inner spacer material layer (ISM31 in FIG. 27) and the first material layer (ISM31_1 in FIG. 27) of the first inner spacer material layer (ISM31 in FIG. 27) formed on the upper surface of the first dummy capping pattern DC1 may be etched by the first etching process EP1. The first material layer ISM42_1 of the second inner spacer material layer ISM42 may be exposed on the upper surface of the active pattern 101 by the first etching process EP1.

For example, the second material layer (ISM31_2 in FIG. 27) of the first inner spacer material layer (ISM31 in FIG. 27) etched on the sidewall of the first plurality of nanosheets NW1 by the first etching process EP1 may be defined as a first etched portion. In addition, a portion of the second material layer (ISM31_2 in FIG. 27) of the first inner spacer material layer (ISM31 in FIG. 27) and the first material layer (ISM31_1 in FIG. 27) of the first inner spacer material layer (ISM31 in FIG. 27) etched on the upper surface of the active pattern 101 by the first etching process EP1 may be defined as a second etched portion. For example, a first etched thickness Et41 of the first etched portion in the first horizontal direction DR1 may be smaller than a second etched thickness Et42 of the second etched portion in the vertical direction DR3.

For example, after the first etching process EP1 is performed, a thickness t41 of the first material layer ISM42_1 of the second inner spacer material layer ISM42 remaining on the sidewall of the first plurality of nanosheets NW1 in the first horizontal direction DR1 may be greater than a thickness t46 of the first material layer ISM42_1 of the second inner spacer material layer ISM2 remaining on the upper surface of the active pattern 101 in the vertical direction DR3. For example, after the first etching process EP1 is performed, the thickness t41 of the first material layer ISM42_1 of the second inner spacer material layer ISM42 remaining on the sidewall of the first plurality of nanosheets NW1 in the first horizontal direction DR1 may be greater than a thickness of the first material layer ISM42_1 of the second inner spacer material layer ISM2 remaining on the upper surface of the first dummy capping pattern DC1 in the vertical direction DR3.

Subsequently, after the fabricating process illustrated in FIGS. 33, and 18 to 22 is performed, the source/drain contact CA, the gate contact CB, the etching stop layer 145, the second interlayer insulating layer 150, the first via V1, the second via V2, the third interlayer insulating layer 160, the first wiring pattern 171, and the second wiring pattern 172 may be formed to fabricate the semiconductor device illustrated in FIG. 26.

Hereinafter, a semiconductor device fabricated by a method for fabricating a semiconductor device according to still other exemplary embodiments of the present disclosure will be described with reference to FIG. 37. Differences from the semiconductor device illustrated in FIGS. 2 and 3 will be mainly described.

Figure 37:
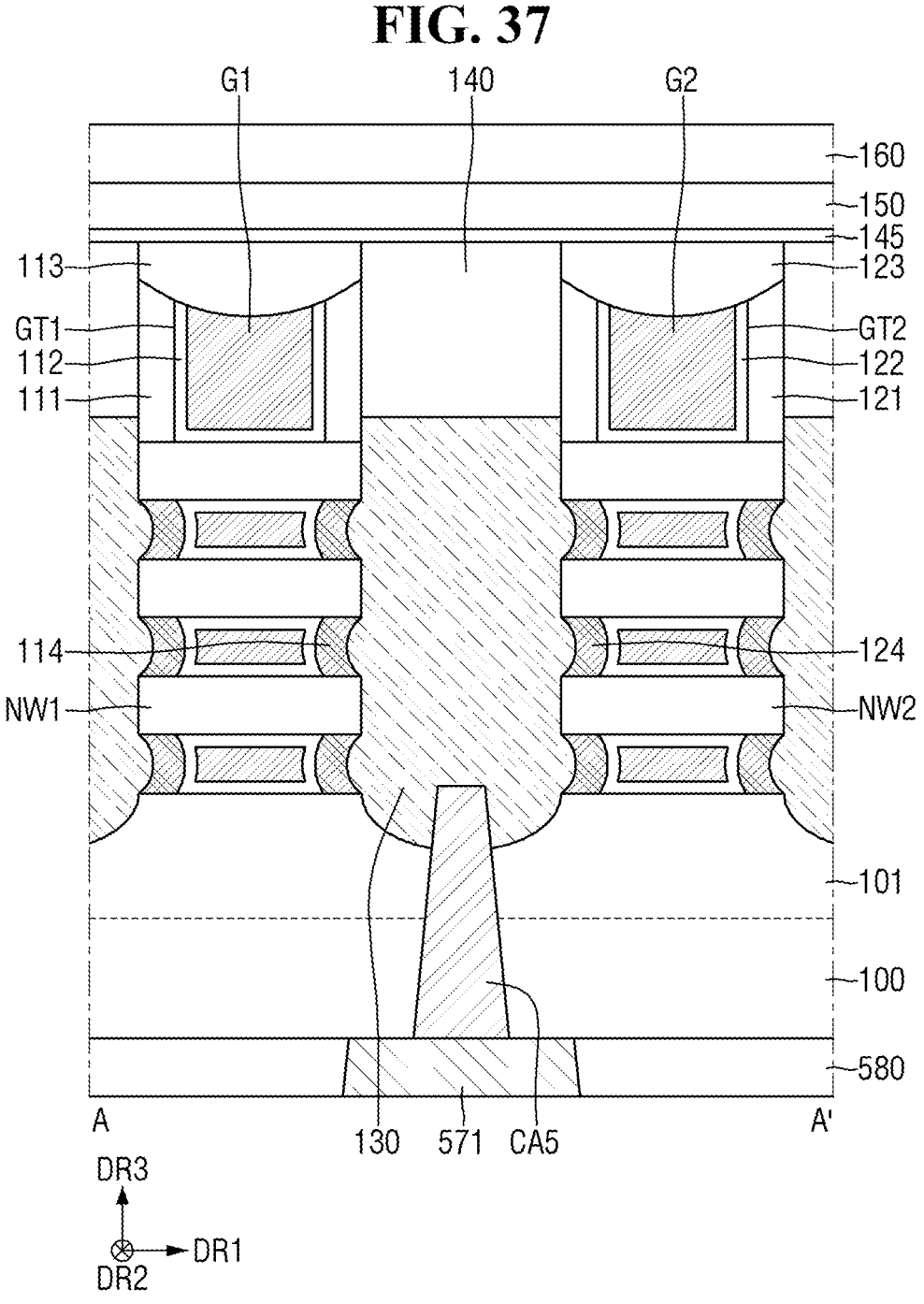

FIG. 37 is a cross-sectional view for describing a semiconductor device fabricated by a method for fabricating a semiconductor device according to still other exemplary embodiments of the present disclosure.

Referring to FIG. 37, in the semiconductor device fabricated by the method for fabricating the semiconductor device according to some still other exemplary embodiments of the present disclosure, a source/drain contact CA5 may penetrate through the substrate 100 and the active pattern 101 from a lower surface of the substrate 100 in the vertical direction DR3 and may be connected to the source/drain region 130.

For example, a fourth interlayer insulating layer 580 may be disposed on the lower surface of the substrate 100. The fourth interlayer insulating layer 580 may include, for example, at least one of silicon oxide, silicon nitride, silicon oxynitride, and a low-k material. A first wiring pattern 571 may be disposed in the fourth interlayer insulating layer 580. The first wiring pattern 571 may be connected to the source/drain contact CA5. For example, the first wiring pattern 571 may be a power rail. Although it is illustrated in FIG. 37 that the first wiring pattern 571 is formed as a single film, this is for convenience of explanation, In some implementations, the first wiring pattern 571 may be formed as multiple films. The first wiring pattern 571 may include a conductive material.

Hereinafter, a method for fabricating a semiconductor device according to still other exemplary embodiments will be described with reference to FIGS. 37 and 38. Differences from the method for fabricating the semiconductor device illustrated in FIGS. 2 to 22 will be mainly described.

FIG. 38 is an intermediate step view for describing a method for fabricating a semiconductor device according to still other exemplary embodiments.

Referring to FIG. 38, after the fabricating process illustrated in FIGS. 4 to 22 is performed, the etching stop layer 145, the second interlayer insulating layer 150, and the third interlayer insulating layer 160 may be sequentially formed on the upper surfaces of the first interlayer insulating layer 140, the first capping pattern 113, and the second capping pattern 123, respectively.

Referring to FIG. 37, a source/drain contact CA5 penetrating through the substrate 100 and the active pattern 101 in the vertical direction DR3 from the lower surface of the substrate 100 and connected to the source/drain region 130 may be formed. Subsequently, a fourth interlayer insulating layer 580 may be formed on a lower surface of each of the substrate 100 and the source/drain contact CA5. A first wiring pattern 571 connected to the source/drain contact CA5 may be formed inside the fourth interlayer insulating layer 580. Through such a fabricating process, the semiconductor device illustrated in FIG. 37 may be fabricated.

The exemplary embodiments of the present disclosure have been described hereinabove with reference to the accompanying drawings, but the present disclosure is not limited to the above-described exemplary embodiments, and may be implemented in various different forms, and one of ordinary skill in the art to which the present disclosure pertains may understand that the present disclosure may be implemented in other specific forms without changing the technical spirit or essential features of the present disclosure. Therefore, it should be understood that the exemplary embodiments described above are illustrative in all aspects and not restrictive.

By way of summation and review, as one of the scaling technologies for increasing the density of semiconductor devices, a multi-gate transistor in which a fin or nanowire-shaped silicon body is formed on a substrate and a gate is formed on a surface of the silicon body has been proposed.

Since such a multi-gate transistor uses a three-dimensional channel, it may be easy to perform scaling. In addition, the multi-gate transistor may improve current control capability even without increasing a length of the gate of the multi-gate transistor. In addition, the multi-gate transistor may effectively suppress a short channel effect (SCE) in which a potential of a channel region is affected by a drain voltage.

Example embodiments have been disclosed herein, and although specific terms are employed, they are used and are to be interpreted in a generic and descriptive sense only and not for purpose of limitation. It will be understood by those of skill in the art that various changes in form and details may be made without departing from the spirit and scope of the present invention as set forth in the following claims.

What is claimed is:

1. A method for fabricating a semiconductor device, the method comprising:

forming an active pattern extending in a first horizontal direction on a substrate, and forming a stacked structure in which a sacrificial layer and a semiconductor layer are alternately stacked on the active pattern, the stacked structure extending in the first horizontal direction;

forming a dummy gate on the active pattern, the dummy gate extending in a second horizontal direction different from the first horizontal;

forming a first source/drain trench on at least one side of the dummy gate on the active pattern by etching the stacked structure, a remaining semiconductor layer being defined as a plurality of nanosheets;

forming a second source/drain trench on the active pattern by etching a portion of a sidewall of the sacrificial layer exposed to the first source/drain trench;

forming a first inner spacer material layer along a sidewall and a bottom surface of the second source/drain trench;

forming a second inner spacer material layer by etching a portion of the first inner spacer material layer exposed by performing a first etching process, the first etching process being is an anisotropic etching process, and at least a portion of the second inner spacer material layer remaining on sidewalls of the nanosheets and the active pattern after the first etching process is performed;

forming a third source/drain trench on the active pattern by etching the second inner spacer material layer by performing a second etching process the second etching process being is an isotropic etching process, an upper surface of the active pattern and the sidewalls of the plurality of nanosheets being exposed by the third source/drain trench, and the second inner spacer material layer remaining between the plurality of nanosheets being defined as an inner spacer; and forming a source/drain region inside the third source/drain trench.

2. The method as claimed in claim 1, wherein:

a portion of the first inner spacer material layer etched on the sidewalls of the plurality of nanosheets by the first etching process is defined as a first etched portion, and another portion of the first inner spacer material layer etched on the active pattern by the first etching process being defined as a second etched portion, and a first etched thickness of the first etched portion in the first horizontal direction is less than a second etched thickness of the second etched portion in a vertical direction.

3. The method as claimed in claim 1, wherein:

the first etching process is a dry etching process, and the second etching process is a wet etching process.

4. The method as claimed in claim 1, wherein each of the first inner spacer material layer and the second inner spacer material layer is in contact with the sacrificial layer.

5. The method as claimed in claim 1, wherein after the first etching process is performed, at least a portion of the second inner spacer material layer remains on an upper surface of the dummy gate.

6. The method as claimed in claim 1, wherein after the first etching process is performed, a thickness of the second inner spacer material layer remaining on the sidewalls of the plurality of nanosheets in the first horizontal direction is greater than a thickness of the second inner spacer material layer remaining on the active pattern in a vertical direction.

7. The method as claimed in claim 1, wherein after the first etching process is performed, a thickness of the second inner spacer material layer remaining on the sidewalls of the plurality of nanosheets in the first horizontal direction is smaller than a thickness of the second inner spacer material layer remaining on the active pattern in a vertical direction.

8. The method as claimed in claim 1, wherein the forming of the first inner spacer material layer includes:

forming a first material layer along the sidewall and the bottom surface of the second source/drain trench; and forming a second material layer including a material different from the first material layer on the first material layer.

9. The method as claimed in claim 8, wherein:

after the first etching process is performed, at least a portion of the second material layer remains on the sidewalls of the plurality of nanosheets, and the first material layer is exposed on the active pattern.

10. The method as claimed in claim 8, wherein after the first etching process is performed, the first material layer is exposed on each of the sidewalls of the plurality of nanosheets and the active pattern.

11. The method as claimed in claim 1, further comprising, after the forming of the source/drain region, forming an interlayer insulating layer covering the source/drain region on an upper surface of the substrate; and forming a source/drain contact penetrating through the interlayer insulating layer in a vertical direction and connected to the source/drain region.

12. The method as claimed in claim 1, further comprising, after the forming of the source/drain region:

forming an interlayer insulating layer covering the source/drain region on an upper surface of the substrate; and forming a source/drain contact penetrating through the substrate and the active pattern in a vertical direction and connected to the source/drain region.

13. The method as claimed in claim 1, further comprising, after the forming of the source/drain region:

forming an interlayer insulating layer covering the source/drain region on an upper surface of the substrate;

removing the dummy gate and the sacrificial layer; and sequentially forming a gate insulating layer and a gate electrode in a portion which the dummy gate and the sacrificial layer are removed.

14. A method for fabricating a semiconductor device, the method comprising:

forming an active pattern extending in a first horizontal direction on a substrate, forming a stacked structure in which a sacrificial layer and a semiconductor layer are alternately stacked on the active pattern, the stacked structure extending in the first horizontal direction;

forming a dummy gate extending in a second horizontal direction different from the first horizontal direction on the active pattern;

forming a first source/drain trench on at least one side of the dummy gate on the active pattern by etching the stacked structure, a remaining semiconductor layer being defined as a plurality of nanosheets;

forming a second source/drain trench on the active pattern by etching a portion of a sidewall of the sacrificial layer exposed to the first source/drain trench;

forming a first inner spacer material layer along a sidewall and a bottom surface of the second source/drain trench;

forming a second inner spacer material layer by etching a portion of exposed the first inner spacer material layer by performing a first etching process, which is a dry etching process, at least a portion of the second inner spacer material layer remaining on sidewalls of the nanosheets and the active pattern after the first etching process is performed;

forming a third source/drain trench on the active pattern by etching the second inner spacer material layer by performing a second etching process, which is a wet etching process, an upper surface of the active pattern and the sidewalls of the plurality of nanosheets being exposed by the third source/drain trench, and the second inner spacer material layer remaining between the plurality of nanosheets being defined as an inner spacer; and forming a source/drain region inside the third source/drain trench, wherein a portion of the first inner spacer material layer etched on the sidewalls of the plurality of nanosheets by the first etching process is defined as a first etched portion, and another portion of the first inner spacer material layer etched on the active pattern by the first etching process is defined as a second etched portion, and wherein a first etched thickness of the first etched portion in the first horizontal direction is smaller than a second etched thickness of the second etched portion in a vertical direction.

15. The method as claimed in claim 14, wherein the first etching process is an anisotropic dry etching process, and the second etching process is an isotropic wet etching process.

16. The method as claimed in claim 14, wherein each of the first inner spacer material layer and the second inner spacer material layer is in contact with the sacrificial layer.

17. The method as claimed in claim 14, wherein after the first etching process is performed, a thickness of the second inner spacer material layer remaining on the sidewalls of the plurality of nanosheets in the first horizontal direction is greater than a thickness of the second inner spacer material layer remaining on the active pattern in the vertical direction.

18. The method as claimed in claim 14, wherein the forming of the first inner spacer material layer includes:

forming a first material layer along the sidewall and the bottom surface of the second source/drain trench; and forming a second material layer including a material different from the first material layer on the first material layer.

19. The method as claimed in claim 14, further comprising, before the forming of the first source/drain trench, forming a gate spacer extending in the second horizontal direction on a sidewall of the dummy gate in the first horizontal direction, wherein the first inner spacer material layer is formed on a sidewall of the gate spacer.

20. A method for fabricating a semiconductor device, the method comprising:

forming an active pattern extending in a first horizontal direction on a substrate, forming a stacked structure in which a sacrificial layer and a semiconductor layer are alternately stacked on the active pattern, the stacked structure extending in the first horizontal direction;

forming a dummy gate extending in a second horizontal direction different from the first horizontal direction on the active pattern;

forming a first source/drain trench on at least one side of the dummy gate on the active pattern by etching the stacked structure, a remaining semiconductor layer being defined as a plurality of nanosheets;

forming a second source/drain trench on the active pattern by etching a portion of a sidewall of the sacrificial layer exposed to the first source/drain trench;

forming a first inner spacer material layer along a sidewall and a bottom surface of the second source/drain trench;

forming a second inner spacer material layer by etching a portion of exposed the first inner spacer material layer by performing a first etching process, which is an anisotropic dry etching process, at least a portion of the second inner spacer material layer remaining on sidewalls of the nanosheets and the active pattern after the first etching process is performed;

forming a third source/drain trench on the active pattern by etching the second inner spacer material layer by performing a second etching process, which is an isotropic wet etching process, an upper surface of the active pattern and the sidewalls of the plurality of nanosheets being exposed by the third source/drain trench, and the second inner spacer material layer remaining between the plurality of nanosheets being defined as an inner spacer; and forming a source/drain region inside the third source/drain trench, wherein:

each of the first inner spacer material layer and the second inner spacer material layer is in contact with the sacrificial layer, a portion of the first inner spacer material layer etched on the sidewalls of the plurality of nanosheets by the first etching process is defined as a first etched portion, and another portion of the first inner spacer material layer etched on the active pattern by the first etching process is defined as a second etched portion, a first etched thickness of the first etched portion in the first horizontal direction is smaller than a second etched thickness of the second etched portion in a vertical direction, and after the first etching process is performed, a thickness of the second inner spacer material layer remaining on the sidewalls of the plurality of nanosheets in the first horizontal direction is greater than a thickness of the second inner spacer material layer remaining on the active pattern in the vertical direction.

* * * * *